(12) United States Patent
Hatfield et al.

(10) Patent No.: US 12,331,759 B2
(45) Date of Patent: Jun. 17, 2025

(54) METHOD OF MAKING AN ACTUATOR FOR A RESONANT ACOUSTIC PUMP

(71) Applicant: LEE VENTUS LTD, Royston (GB)

(72) Inventors: Stuart Andrew Hatfield, Royston (GB); James Edward Mccrone, Royston (GB); Juho Pekka Piiparinen, Royston (GB); Andrew Laurence York, Royston (GB)

(73) Assignee: LEE VENTUS LTD., Melbourn (GB)

( * ) Notice: Subject to any disclaimer, the term of this patent is extended or adjusted under 35 U.S.C. 154(b) by 0 days.

(21) Appl. No.: 18/018,356

(22) PCT Filed: Jul. 8, 2021

(86) PCT No.: PCT/GB2021/051741
§ 371 (c)(1),
(2) Date: Jan. 27, 2023

(87) PCT Pub. No.: WO2022/023703
PCT Pub. Date: Feb. 3, 2022

(65) Prior Publication Data
US 2023/0287904 A1    Sep. 14, 2023

(30) Foreign Application Priority Data
Jul. 31, 2020 (GB) ..................... 2011921

(51) Int. Cl.
*F04F 7/00* (2006.01)
*F04B 43/04* (2006.01)
(Continued)

(52) U.S. Cl.
CPC .............. *F04F 7/00* (2013.01); *F04B 43/046* (2013.01); *H04R 17/10* (2013.01); *H10N 30/01* (2023.02);
(Continued)

(58) Field of Classification Search
CPC ...... F04F 7/00; Y10T 29/42; Y10T 29/49401; F04B 43/046
(Continued)

(56) References Cited

U.S. PATENT DOCUMENTS 1,970,473 A    8/1934    Parker
3,360,664 A    12/1967   Straube
(Continued)

FOREIGN PATENT DOCUMENTS

DE    4422743 A1    1/1996
DE    19539020 A1   4/1997
(Continued)

OTHER PUBLICATIONS

International Preliminary Report on Patentability issued Jan. 31, 2023; International Application No. PCT/GB2021/051741; International Filing Date Jul. 8, 2021 (8 pgs).
(Continued)

*Primary Examiner* — Thiem D Phan
(74) *Attorney, Agent, or Firm* — CANTOR COLBURN LLP

(57) ABSTRACT

A method of making an actuator for a resonant acoustic pump comprises: forming a through-hole in a ceramic material of a piezoelectric layer of the actuator, prior to assembly of the piezoelectric layer with other layers of the actuator; forming a through-hole in a flexible circuit layer of the actuator; forming a through-hole in an end plate layer of the actuator; and disposing each of the piezoelectric layer and the end plate layer on a respective one of opposite sides of the flexible circuit layer, so that the through-holes align to provide a passageway for a fluid to pass through the actuator.

17 Claims, 16 Drawing Sheets

(51) Int. Cl.
*H04R 17/10* (2006.01)
*H10N 30/01* (2023.01)
*H10N 30/073* (2023.01)
*H10N 30/085* (2023.01)

(52) U.S. Cl.
CPC ......... *H10N 30/073* (2023.02); *H10N 30/085* (2023.02); *Y10T 29/42* (2015.01)

(58) Field of Classification Search
USPC ................. 29/25.35, 428, 890.09, 890.1
See application file for complete search history.

(56) References Cited

U.S. PATENT DOCUMENTS

| | | | |
|---|---|---|---|
| 3,745,384 | A | 7/1973 | Blanchard |
| 5,769,608 | A | 6/1998 | Seale |
| 5,961,298 | A | 10/1999 | Bar-Cohen et al. |
| 6,079,214 | A | 6/2000 | Bishop |
| 6,203,291 | B1 | 3/2001 | Stemme et al. |
| 6,247,905 | B1 | 6/2001 | Dohner |
| 6,582,066 | B1 | 6/2003 | Temple |
| 6,672,847 | B2 | 1/2004 | Dooley |
| 7,258,774 | B2 | 8/2007 | Chou et al. |
| 7,424,827 | B2 | 9/2008 | Yamada et al. |
| 7,553,135 | B2 | 6/2009 | Cho et al. |
| 7,972,124 | B2 | 7/2011 | Hirata et al. |
| 8,123,502 | B2 | 2/2012 | Blakey et al. |
| 8,297,947 | B2 | 10/2012 | Van Rensburg et al. |
| 8,325,477 | B2 | 12/2012 | Ishikawa et al. |
| 8,734,131 | B2 | 5/2014 | Mccrone et al. |
| 8,763,633 | B2 * | 7/2014 | Buckland ............ F04B 53/1037 137/625.33 |
| 8,821,134 | B2 | 9/2014 | Van Rensburg |
| 9,103,337 | B2 | 8/2015 | Hirata et al. |
| 9,127,665 | B2 | 9/2015 | Locke et al. |
| 9,506,463 | B2 | 11/2016 | Locke et al. |
| 9,506,464 | B2 | 11/2016 | Hirata et al. |
| 10,087,923 | B2 | 10/2018 | Campbell et al. |
| 10,107,281 | B2 | 10/2018 | Tanaka et al. |
| 10,598,192 | B2 | 3/2020 | Bukland et al. |
| 10,975,855 | B2 | 4/2021 | Campbell et al. |
| 11,285,274 | B2 * | 3/2022 | Germinario ....... A61M 15/0021 |
| 2001/0035700 | A1 | 11/2001 | Percin et al. |
| 2002/0146333 | A1 | 10/2002 | Drevet |
| 2003/0124006 | A1 | 7/2003 | Dooley |
| 2004/0000843 | A1 | 1/2004 | East |
| 2005/0001287 | A1 | 1/2005 | Aisenbrey |
| 2005/0219288 | A1 | 10/2005 | Vogeley et al. |
| 2006/0147324 | A1 | 7/2006 | Tanner et al. |
| 2006/0159568 | A1 | 7/2006 | Lutz |
| 2007/0035213 | A1 | 2/2007 | Nakajima |
| 2007/0138914 | A1 | 6/2007 | Ishikawa et al. |
| 2008/0038125 | A1 | 2/2008 | Onishi et al. |
| 2009/0087323 | A1 | 4/2009 | Blakey et al. |
| 2009/0104056 | A1 | 4/2009 | Miyazawa |
| 2009/0297372 | A1 | 12/2009 | Amirouche et al. |
| 2010/0002051 | A1 | 1/2010 | Yoshimura |
| 2010/0310398 | A1 | 12/2010 | Janse Van Rensburg et al. |
| 2011/0076170 | A1 | 3/2011 | Fujisaki et al. |
| 2011/0280755 | A1 | 11/2011 | Wackerle et al. |
| 2013/0071273 | A1 | 3/2013 | Locke et al. |
| 2013/0236338 | A1 | 9/2013 | Locke et al. |
| 2015/0023821 | A1 | 1/2015 | Campbell et al. |
| 2015/0071797 | A1 | 3/2015 | Takeuchi |
| 2017/0002839 | A1 | 1/2017 | Bukland et al. |

FOREIGN PATENT DOCUMENTS

| | | |
|---|---|---|
| EP | 1952992 B1 | 7/2011 |
| EP | 1529963 B1 | 4/2013 |
| EP | 3080460 B1 | 10/2016 |
| EP | 3147504 A1 | 3/2017 |
| GB | 2583880 A | 11/2020 |
| JP | 2008537057 A | 9/2008 |
| JP | 2009156454 A | 7/2009 |
| JP | 2010151012 A | 7/2010 |
| JP | 2012528980 A | 11/2012 |
| JP | 2012140967 A1 | 7/2014 |
| RU | 2008147087 A | 6/2010 |
| WO | 9310910 A1 | 6/1993 |
| WO | 9419609 A1 | 9/1994 |
| WO | 9600849 A1 | 1/1996 |
| WO | 2004090335 A1 | 10/2004 |
| WO | 2005001287 A1 | 1/2005 |
| WO | 2006111775 A1 | 10/2006 |
| WO | 2009072261 A1 | 6/2009 |
| WO | 2009087714 A1 | 7/2009 |
| WO | 2009112866 A1 | 9/2009 |
| WO | 2009122340 A1 | 10/2009 |
| WO | 2010139916 A1 | 12/2010 |
| WO | 2010139917 A1 | 12/2010 |
| WO | 2011058140 A2 | 5/2011 |
| WO | 2011095795 A1 | 8/2011 |
| WO | 2011097361 A2 | 8/2011 |
| WO | 2013117945 A1 | 8/2013 |
| WO | 2013134056 A1 | 9/2013 |
| WO | 2019138676 A1 | 4/2020 |
| WO | 2020115502 A1 | 6/2020 |
| WO | 2020128426 A1 | 6/2020 |

OTHER PUBLICATIONS

International Search Report mailed Oct. 1, 2021; International Application No. PCT/GB2021/051741; International Filing Date Jul. 8, 2021 (3 pgs).

Written Opinion mailed Oct. 1, 2021; International Application No. PCT/GB2021/051741; International Filing Date Jul. 8, 2021 (7 pgs).

GB Office Action for corresponding GB Application No. 2301268. 5; Mailing Date, Apr. 8, 2024.

U.S. Advisory Action corresponding to U.S. Appl. No. 17/394,485; Mailing Date, Oct. 30, 2023.

U.S. Final Office Action corresponding to U.S. Appl. No. 17/394,485; Mailing Date, Aug. 28, 2023.

U.S. Non-Final Office Action corresponding to U.S. Appl. No. 17/394,485; Mailing Date, May 11, 2023.

U.S. Notice of Allowance corresponding to U.S. Appl. No. 17/394,485; Mailing Date, Nov. 20, 2023.

Search and Examination Report issued in British Patent Application No. 2411840.8; Application Filing Date Jul. 8, 2021; Date of Mailing Dec. 9, 2024 (5 pages).

* cited by examiner

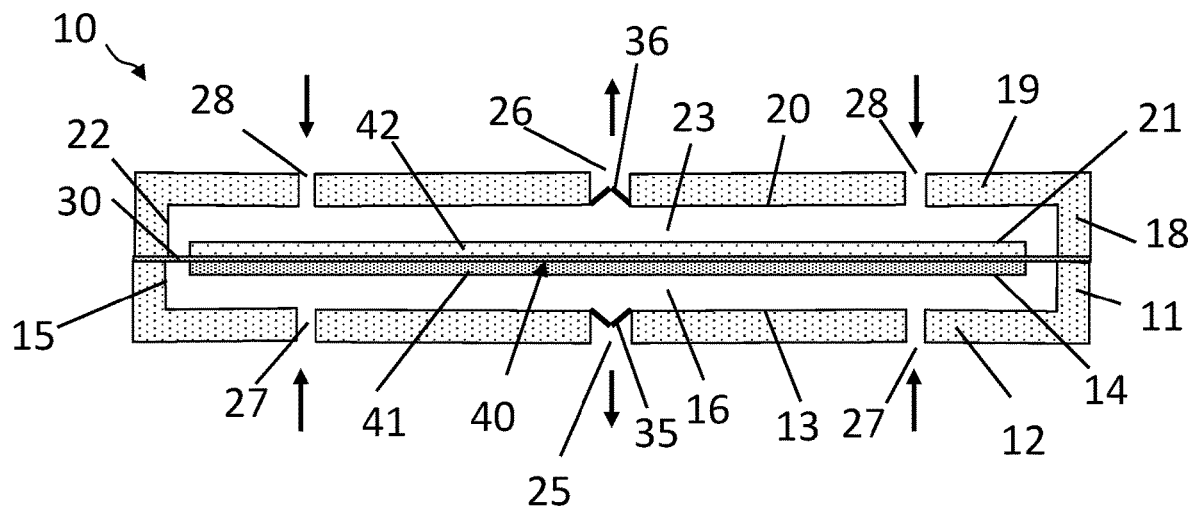

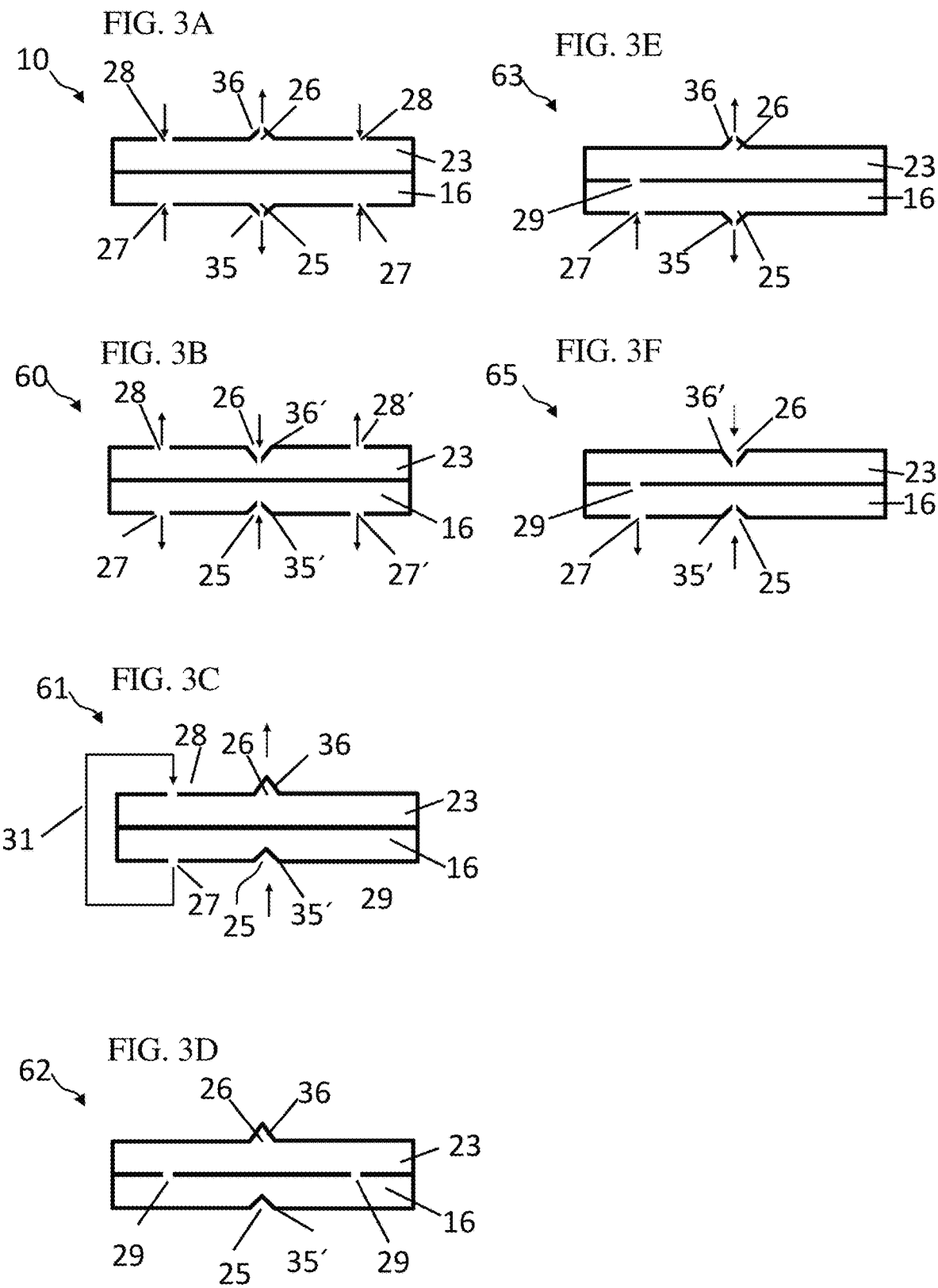

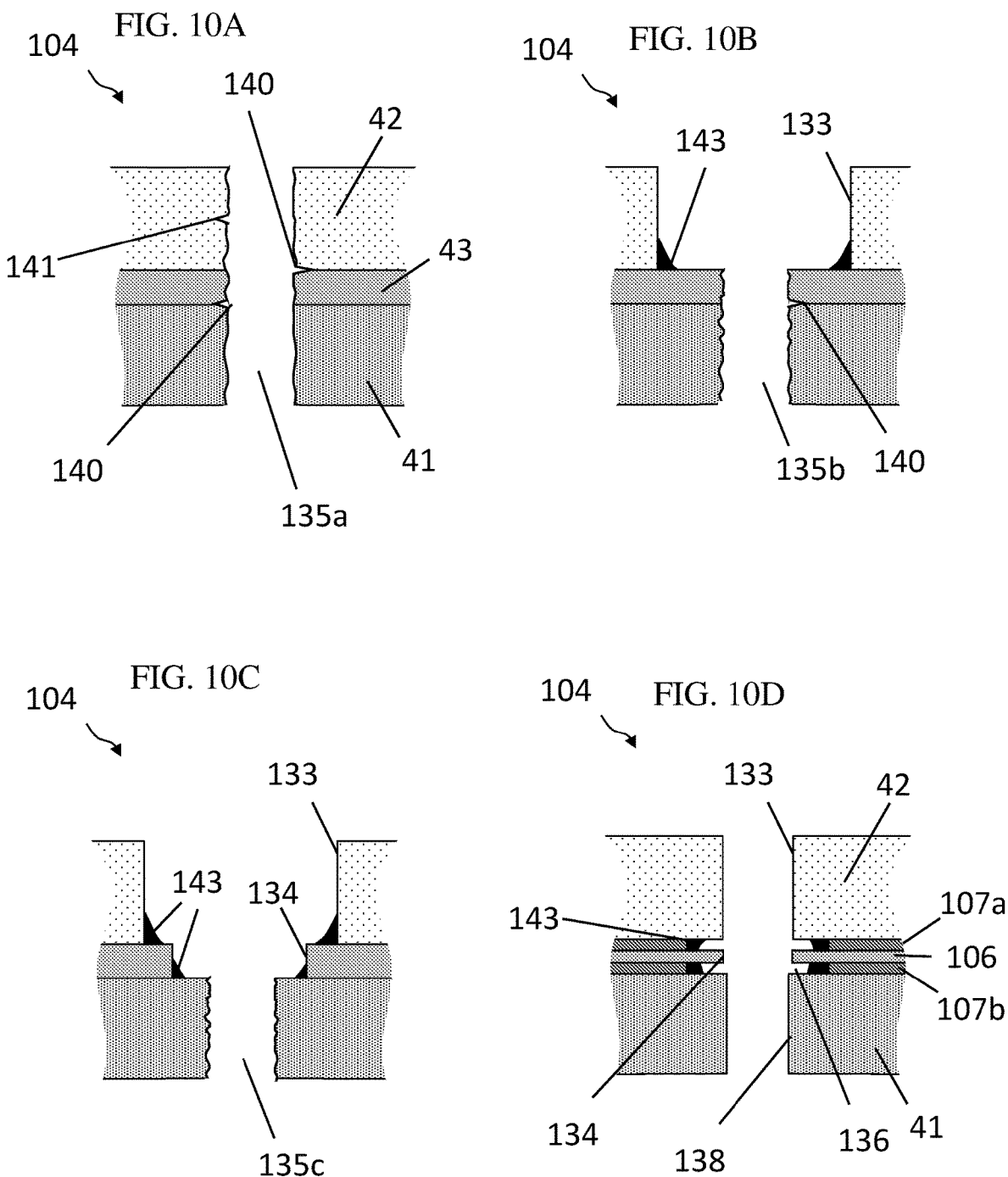

METHOD OF MAKING AN ACTUATOR FOR A RESONANT ACOUSTIC PUMP

FIELD OF THE INVENTION

The present invention relates to an actuator for a resonant acoustic pump, in particular a method of making an actuator for a resonant acoustic pump.

BACKGROUND

High amplitude acoustic resonance has been employed within disc-shaped cavities in which radial pressure oscillations are excited. Such pumps typically have a substantially disc-shaped cavity with a high aspect ratio, i.e., the ratio of the radius of the cavity to the height of the cavity.

Such resonant acoustic pumps operate on a different physical principle to displacement pumps i.e. pumps in which the volume of the pumping chamber is made smaller in order to compress and expel fluid therefrom through an outlet valve and is increased in size so as to draw fluid therein through an inlet valve. An example of such a pump is described in DE4422743 ("Gerlach"), and further examples of displacement pumps may be found in US2004000843, WO2005001287, DE19539020, and U.S. Pat. No. 6,203,291.

By contrast, WO 2006/111775 describes a pump that applies the principle of acoustic resonance to motivate fluid through a cavity of the pump. In the operation of such a pump, pressure oscillations within the pump cavity compress fluid within one part of the cavity while expanding fluid in another part of the cavity. In contrast to more conventional displacement pump, an acoustic resonance pump does not require change in the volume of the pump cavity in order to achieve pumping operation. Instead, the acoustic resonance pump's design is adapted to efficiently create, maintain, and rectify the acoustic pressure oscillations within the cavity.

The pump described in WO 2006/111775 has one or more valves for controlling the flow of fluid through the pump. The valves are capable of operating at high frequencies, as it is preferable to operate the pump at frequencies beyond the range of human hearing.

In prior art resonant acoustic pumps, the driven end wall is typically mounted to the side wall of the pump at an interface, and the efficiency of the pump has been found to affected by this interface. It is desirable to maintain the efficiency of the pump by structuring the interface so that it does not significantly decrease or dampen the motion of the driven end wall thereby mitigating any reduction in the amplitude of the fluid pressure oscillations within the cavity. By way of an example, WO2010/139916 describes a pump wherein an actuator forms a portion of the driven end wall, and an isolator functions as the interface between actuator and the side wall. The isolator provides an interface that reduces damping of the motion of the driven end wall.

Pump performance can be increase by pneumatically connecting two separate pumping chambers, either in series or in parallel, to increase the pressure or flow rate provided. It is known, as described in WO2013/117945, to dispose the two chambers on either side of a common end wall formed from an actuator and an isolator. In practice, providing such pneumatic connection between two or more cavities is challenging—the addition of the external pneumatic path adds complexity to the pump and its manufacture and increases the size of the pump.

A pneumatic connection between the two cavities might be formed by an aperture through the driven end wall, avoiding the need for an external pneumatic path. To minimize disruption to the radial oscillations of fluid pressure within the two cavities such aperture must be located close to a nodal region of such oscillations, because in this region the pressure difference between the two cavities is substantially constant. If such aperture is located away from a nodal region then air will be driven back and forth between the two cavities during operation due to the alternating pressure difference across the aperture, leading to loss of efficiency in pump operation. As a consequence of mode shape matching between the actuator motion and the radial oscillations of fluid pressure within the two cavities, locating the aperture in the region of a pressure node means, that it must be formed within the central part of the driven end wall, generally through the actuator itself.

However, the inventors have recognised that forming a hole through the actuator is challenging, with conventional processes such as mechanical drilling and laser-drilling applied to an assembled actuator being expensive and/or a source of defects leading to failure of the actuator in operation.

Therefore, for reasons of pump size, lifetime and manufacturing cost and complexity, it is desirable to provide a direct fluid/pneumatic interconnect between the cavities which overcomes these limitations.

SUMMARY OF THE INVENTION

According to an aspect of the invention, there is provided a method of making an actuator for a resonant acoustic pump, the method comprising: forming a through-hole in a ceramic material of a piezoelectric layer of the actuator, prior to assembly of the piezoelectric layer with other layers of the actuator; forming a through-hole in a flexible circuit layer of the actuator; forming a through-hole in an end plate layer of the actuator; and disposing each of the piezoelectric layer and the end plate layer on a respective one of opposite sides of the flexible circuit layer, so that the through-holes align to provide a passageway for a fluid to pass through the actuator.

Forming the through-hole in the ceramic material of the piezoelectric layer, prior to combining the piezoelectric layer with other layers into an actuator assembly, avoids creating material defects in the piezoelectric layer and the other layers, which might otherwise occur if all the through-holes were formed in the assembled actuator.

The method may comprise: forming the through-hole in the ceramic material of the piezoelectric layer of the actuator prior to firing the ceramic material; and disposing the fired piezoelectric layer on the respective one of the opposite sides of the flexible circuit layer.

Forming the through-hole in the ceramic material before firing, i.e. while the material is in a "green body" state, is particularly effective for avoiding defects.

The method may comprise forming the through-hole in the flexible circuit layer after disposing the piezoelectric layer on the flexible circuit layer.

The method may comprise forming the through-hole in the end plate layer after disposing the end plate layer on the flexible circuit layer.

The method may comprise forming the through-hole in the flexible circuit layer before disposing the piezoelectric layer on the flexible circuit layer.

The method may comprise forming the through-hole in the end plate layer before disposing the end plate layer on the flexible circuit layer.

Forming one or more of the through-holes may comprise removing material from the respective layer.

The method may comprise forming each of the through-holes to extend through the respective layer substantially perpendicularly to the plane of the layer, such that the passageway extends substantially perpendicularly to the plane of the actuator when the piezoelectric layer and the end plate layer are disposed on the opposite sides of the flexible circuit layer.

The method may comprise: forming the through-hole of the piezoelectric layer to have a first width; forming the through-hole of the flexible circuit layer to have a second width that is smaller than the first width; and disposing the piezoelectric layer on the flexible circuit layer using an adhesive layer there between, so as to provide an adhesive fillet at an interface between the through-hole of the piezoelectric layer and the flexible circuit layer.

The first width may be between 1 mm and 3 mm; and the second width may be between 0.3 mm and 2 mm.

The method may comprise: forming the through-hole of the end plate layer to have a third width that is smaller than the second width; and disposing the end plate layer on the flexible circuit layer using an adhesive layer there between, so as to provide an adhesive fillet at an interface between the through-hole of the flexible circuit layer and the end plate layer.

The third width may be between 0.3 mm and 2 mm.

The flexible circuit layer may comprise a substrate sub-layer located between first and second conductor sub-layers, and the method may comprise: forming the through-hole of the piezoelectric layer to have a first width; forming the through-hole of the end plate layer to have a second width that is substantially the same as the first width; forming the through-hole of the flexible circuit layer such as to have: a third width through the substrate sub-layer that is substantially the same as the first width; and a fourth width through at least one of the first and second conductor sub-layers that is greater than the first width; and disposing each of the fired piezoelectric layer and the end plate layer on a respective one of the first and second conductor sub-layers using an adhesive layer there between, so as to provide an adhesive fillet in a recess formed at the fourth width between at least one of the piezoelectric layer and the end plate layer, and the substrate sub-layer.

The first width may be between 0.3 mm and 2 mm.

The method may comprise forming a plurality of the through-holes in each of the piezoelectric layer, the flexible circuit layer, and the end plate layer, thereby to provide a plurality of said passageways for the fluid to pass through the actuator.

The through-holes may be circular and may have a diameter of between 75 μm and 500 μm.

The through-holes may be non-circular.

The method may comprise providing any or all of the through-holes with reinforcing structures.

According to another aspect of the invention, there is provided an actuator for a resonant acoustic pump, made according to a method described herein above.

According to another aspect of the invention, there is provided a resonant acoustic pump comprising an actuator made according to a method described herein above, wherein at least one of the passageways is located at a radial distance of about $0.63(r)+/-0.2(r)$ from the centre of the actuator where r is the radius of a cavity in the resonant acoustic pump.

According to another aspect of the invention, there is provided a resonant acoustic pump comprising: a pump body comprising first and second end walls connected to a peripheral side wall, each of the first and second end walls comprising an aperture including a one-way valve configured to allow a fluid to pass through the respective end wall in one direction only; an actuator located between the first and second end walls and connected to the peripheral side wall by an isolator so as to define first and second cavities for containing the fluid, each of the cavities being substantially cylindrical and having a characteristic height h and a characteristic radius r from the axis of the cylinder, a ratio of the radius r to the height h being greater than about 1.2; at least one cavity connection aperture provided in the isolator or in the peripheral side wall for passage of the fluid between the first and second cavities, wherein: the actuator is configured to oscillate in an axial direction in order to generate radial pressure oscillations of the fluid in the first and second cavities, such as to include at least one annular pressure node at which a pressure difference between the first and second cavities is substantially constant; and the at least one cavity connection aperture is located away from the at least one annular pressure node.

Providing the cavity connection aperture in the isolator (or in the isolator part of a combined actuator and isolator) advantageously avoids the manufacturing difficulties of forming a through-hole (aperture) in the actuator.

Said at least one cavity connection aperture may be provided in the isolator between a radially outer edge of the isolator and a radially outer edge of the actuator, such that the cavity connection aperture is fully surrounded by the material of the isolator.

Said at least one cavity connection aperture may be provided in the isolator at a radially outer edge of the isolator, such that the cavity connection aperture is partially surrounded by the material of the isolator and partially surrounded by the peripheral side wall.

The characteristic height h and the characteristic radius r of each of the first and second cavities may be related by the equation $h^2/r > 4 \times 10^{-10}$ metres.

$h^2/r$ may be between about $10^{-3}$ meters and about $10^{-6}$ meters.

The radius (r) of the first and second cavities may be between 6 mm and 13 mm.

The total volume of the first and second cavities may be less than about 10 ml.

Said at least one cavity connection aperture provided in the isolator may have a width of between 0.3 mm and 2 mm.

Said at least one cavity connection aperture provided in the isolator may extend through the isolator substantially perpendicularly to the plane of the isolator.

A plurality of said cavity connection apertures may be provided in the isolator.

The summation of the areas of the plurality of cavity connection apertures provided in the isolator may be less than 10%, preferably less than 5%, more preferably less than 3%, of the area of the first end wall or the second end wall.

The pump body may comprise two half-bodies each comprising one of the first and second end walls and a portion of the peripheral side wall, the isolator being clamped between said portions of the peripheral side wall.

Said at least one cavity connection aperture may be provided in the peripheral side wall and extend radially outward of the first and second cavities.

Said at least one cavity connection aperture may comprise grooves provided in clamping surfaces of the pump half-bodies.

BRIEF DESCRIPTION OF THE DRAWINGS

Embodiments will now be described, by way of example, with reference to the accompanying figures in which:

FIG. 1A shows a two-cavity pump which includes a combined actuator and isolator assembly;

FIGS. 1B and 1C show, respectively, a graph of the displacement oscillations of the driven end wall of the pump, and a graph of the pressure oscillations within the cavity of the pump of FIG. 1A;

FIGS. 3A, 3B, 3C, 3D, 3E and 3F show schematic cross sections of two-cavity pumps having various inlet and outlet configurations;

FIGS. 10A, 10B, 10C, and 10D show different practical approaches to providing a direct pneumatic interconnect through an actuator, according to the invention;

DETAILED DESCRIPTION

In the following detailed description of several illustrative embodiments, reference is made to the accompanying drawings that form a part hereof, and in which is shown by way of illustration specific preferred embodiments in which the invention may be practiced. These embodiments are described in sufficient detail to enable those skilled in the art to practice the invention, and it is understood that other embodiments may be utilized and that logical structural, mechanical, electrical, and chemical changes may be made without departing from the scope of the invention. To avoid detail not necessary to enable those skilled in the art to practice the embodiments described herein, the description may omit certain information known to those skilled in the art. The following detailed description is, therefore, not to be taken in a limiting sense, and the scope of the illustrative embodiments are defined only by the appended claims.

The present disclosure includes several possibilities for providing a direct pneumatic interconnect between cavities in a two-cavity acoustic resonance pump.

Figure 1D:
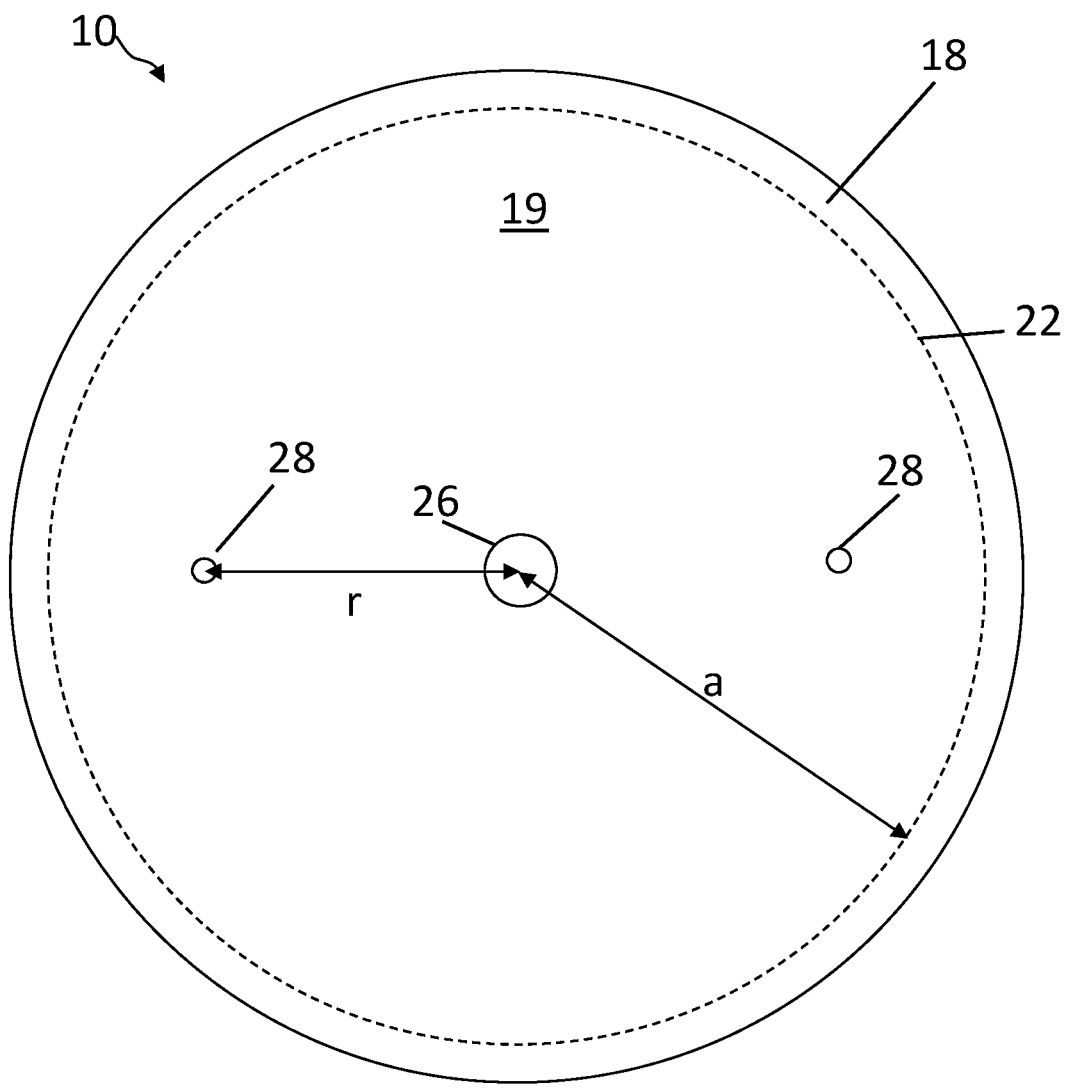
FIG. 1D shows a top view of the pump of FIG. 1A.

FIG. 1A is a schematic cross-section of a two-cavity pump 10. Referring also to FIG. 1D, pump 10 comprises a first pump body having a substantially cylindrical shape including a cylindrical wall 11 closed at one end by a base 12 and closed at the other end by an end plate 41. An isolator 30, which may be a ring-shaped or disc-shaped isolator, is disposed between the end plate 41 and the other end of the cylindrical wall 11 of the first pump body. The cylindrical wall 11 and base 12 may be a single component comprising the first pump body. Pump 10 also comprises a second pump body having a substantially cylindrical shape including a cylindrical wall 18 closed at one end by a base 19 and closed at the other end by a piezoelectric disc 42. The isolator 30 is disposed between the piezoelectric disc 42 and the other end of the cylindrical wall 18 of the second pump body. The cylindrical wall 18 and base 19 may be a single component comprising the second pump body. The first and second pump bodies may be mounted to other components or systems.

The internal surfaces of the cylindrical wall 11, the base 12, the end plate 41, and the isolator 30 form a first cavity 16 within the pump 10 wherein said first cavity 16 comprises a side wall 15 closed at both ends by end walls 13 and 14. The end wall 13 is the internal surface of the base 12 and the side wall 15 is the inside surface of the cylindrical wall 11. The end wall 14 comprises a central portion corresponding to a surface of the end plate 41 and a peripheral portion corresponding to a first surface of the isolator 30. Although the first cavity 16 is shown as substantially circular in shape, the first cavity 16 may also be elliptical or other shape. The internal surfaces of the cylindrical wall 18, the base 19, the piezoelectric disc 42, and the isolator 30 form a second cavity 23 within the pump 10 wherein said second cavity 23 comprises a side wall 22 closed at both ends by end walls 20 and 21. The end wall 20 is the internal surface of the base 19 and the side wall 22 is the inside surface of the cylindrical wall 18. The end wall 21 comprises a central portion corresponding to the inside surface of the piezoelectric disc 42 and a peripheral portion corresponding to a second surface of the isolator 30. Although the second cavity 23 is shown as substantially circular in shape, the second cavity 23 may also be elliptical or other shape. The cylindrical walls 11, 18 and the bases 12, 19 of the first and second pump bodies may be formed from any suitable rigid material including, without limitation, metal, ceramic, glass, plastic, or a composite of these.

The pump 10 also comprises a piezoelectric disc 42 operatively connected to the end plate 41 to form an actuator 40. In turn, the actuator 40 is operatively associated with the central portion of the end walls 14 and 21. The piezoelectric disc 42 may be formed of a piezoelectric material or any electrically active material such as, for example, an electrostrictive or magnetostrictive material. The end plate 41 preferably possesses a bending stiffness similar to the piezoelectric disc 42 and may be formed of an electrically inactive material such as a metal or ceramic. When the piezoelectric disc 42 is excited by an oscillating electrical current, the piezoelectric disc 42 attempts to expand and contract in a radial direction relative to the longitudinal axis of the cavities 16, 23 causing the actuator 40 to bend. The bending of the actuator 40 induces an axial deflection of the end walls 14, 21 in a direction substantially perpendicular to the end walls 14, 21. The end plate 41 may also be formed from an electrically active material such as, for example, a piezoelectric, magnetostrictive, or electrostrictive material.

The pump 10 further comprises at least two apertures extending from the first cavity 16 to the outside of the pump 10, wherein at least a first one of the apertures contains a valve to control the flow of fluid through the aperture. The aperture containing a valve may be located at any position in the cavity 16 where the actuator 40 generates a pressure differential between the cavity 16 and the outside of the pump 10 as described below in more detail. One preferred pump comprises an aperture with a valve located at approximately the centre of the end wall 13. The pump 10 shown in FIGS. 1A and 1D comprises a primary aperture 25 extending from the cavity 16 through the base 12 of the pump body at about the centre of the end wall 13 and containing a valve 35. The valve 35 is mounted within the primary aperture 25 and permits the flow of fluid in one direction as indicated by the arrow so that it functions as an outlet for the pump 10. The second aperture 27 may be located at any position within the cavity 16 other than the location of the aperture 25 having the valve 35. In one preferred pump 10, the second aperture is disposed between the centre of the end wall 13 and the side wall 15. The pump 10 shown in FIGS. 1A and 1D comprises two secondary apertures 27 extending from the cavity 16 through the base 12 that are disposed between the centre of the end wall 13 and the side wall 15.

The pump 10 further comprises at least two apertures extending from the cavity 23 to the outside of the pump 10, wherein at least a first one of the apertures may contain a valve to control the flow of fluid through the aperture. The aperture containing a valve may be located at any position in the cavity 23 where the actuator 40 generates a pressure differential between the cavity 23 and the outside of the pump 10 as described below in more detail. One preferred pump 10 comprises an aperture with a valve located at approximately the centre of the end wall 20. The pump 10 shown in FIGS. 1A and 1D comprises a primary aperture 26 extending from the cavity 23 through the base 19 of the pump body at about the centre of the end wall 20 and containing a valve 36. The valve 36 is mounted within the primary aperture 26 and permits the flow of fluid in one direction as indicated by the arrow so that it functions as an outlet for the pump 10. The second aperture 28 may be located at any position within the cavity 23 other than the location of the aperture 26 having the valve 36. In one preferred the pump 10, the second aperture is disposed between the centre of the end wall 20 and the side wall 22. The pump 10 shown in FIGS. 1A and 1D comprises two secondary apertures 28 extending from the cavity 23 through the base 19 that are disposed between the centre of the end wall 20 and the side wall 22.

Although valves are not shown in the secondary apertures 27, 28 in the pump 10 shown in FIG. 1, the secondary apertures 27, 28 may include valves to improve performance if necessary. In the pump 10 of FIG. 1, the primary apertures 25, 26 include valves so that fluid is drawn into the cavities 16, 23 of the pump 10 through the secondary apertures 27, 28 and pumped out of the cavities 16, 23 through the primary aperture 25, 26 as indicated by the arrows.

The valves 35 and 36 allow fluid to flow through in substantially one direction as described above. The valves 35 and 36 may be a ball valve, a diaphragm valve, a swing valve, a duck-bill valve, a clapper valve, a lift valve, or any other type of check valve or any other valve that allows fluid to flow substantially in only one direction. Some valve types may regulate fluid flow by switching between an open and closed position. For such valves to operate at the high frequencies generated by the actuator 40, the valves 35 and 36 must have an extremely fast response time such that they are able to open and close on a timescale significantly shorter than the timescale of the pressure variation. One arrangement of the valves 35 and 36 achieves this by employing an extremely light flap valve which has low inertia and consequently is able to move rapidly in response to changes in differential pressure across the valve structure.

The dimensions of the pumps described herein in respect of the invention should satisfy the following inequality with respect to the relationship between the height (h) of the cavities 16 and 23 and the radius (a) of the cavities 16 and 23, which is the distance from the longitudinal axis of the cavity to its respective side wall 15, 22:

$$a/h > 1.2$$

The dimensions of the pumps described herein in respect of the invention should preferably satisfy the following inequality:

$$h^2/a > 4 \times 10^{-10} \text{ meters}$$

In one embodiment, the ratio of the cavity radius to the cavity height (a/h) is between about 10 and about 50 when the fluid within the cavities 16, 23 is a gas. In this example, the volume of the cavities 16, 23 may be less than about 10 ml. Additionally, the ratio of $h^2/a$ is preferably within a range between about $10^{-3}$ and about $10^{-6}$ meters where the working fluid is a gas as opposed to a liquid. In the case that a cavity has a non-uniform height, h is understood to be the arithmetic mean height of the cavity by radius.

The secondary apertures 27, 28 may be located where the amplitude of the pressure oscillations within the cavities 16, 23 is close to zero, i.e., the radial nodal points 57 of the pressure oscillations as indicated in FIG. 1C. Where the cavities 16, 23 are cylindrical, the radial dependence of the pressure oscillation may be approximated by a Bessel function of the first kind and the radial node of the lowest-order pressure oscillation within the cavity occurs at a distance of between approximately 0.43a and 0.83a, and more usually close to 0.63a from the centre of the end walls 13, 20 or the longitudinal axis of the cavities 16, 23. Thus, the secondary apertures 27, 28 are preferably located at a radial distance (r) from the centre of the end walls 13, 20, where (r) is between approximately 0.43a and 0.83a, and more preferably close to 0.63a, i.e., close to the nodal points of the pressure oscillations.

Additionally, the pumps disclosed herein should preferably satisfy the following inequality relating the cavity radius (a) and operating frequency (f) which is the frequency at which the actuator 40 vibrates to generate the axial displacement of the end walls 14, 21. The inequality equation is as follows:

$$\frac{k_0(c_s)}{2\pi f} \le a \le \frac{k_0(c_f)}{2\pi f}$$

wherein the speed of sound in the working fluid within the cavities 16, 23, (c) may range between a slow speed ($c_s$) of about 115 m/s and a fast speed ($c_f$) equal to about 1,970 m/s as expressed in the equation above, and $k_0$ is a constant ($k_0$=3.83). The frequency of the oscillatory motion of the actuator 40 is preferably about equal to the lowest resonant frequency of radial pressure oscillations in the cavities 16, 23, but may be within 20% therefrom. The lowest resonant frequency of radial pressure oscillations in the cavities 16, 23 is preferably greater than 500 Hz.

Referring now to the pump 10 in operation, the piezoelectric disc 42 is excited to expand and contract in a radial direction against the end plate 41 which causes the actuator 40 to bend, thereby inducing an axial displacement of the driven end walls 14, 21 in a direction substantially perpendicular to the driven end walls 14, 21. The actuator 40 is operatively associated with the central portion of the end walls 14, 21 as described above so that the axial displacement oscillations of the actuator 40 cause axial displacement oscillations along the surface of the end walls 14, 21 with maximum amplitudes of oscillations 48, i.e., anti-node displacement oscillations, at about the centre of the end walls 14, 21. Referring back to FIG. 1A, the displacement oscillations and the resulting pressure oscillations of the pump 10 as generally described above are shown more specifically in FIGS. 1B and 1C, respectively. The phase relationship between the displacement oscillations and pressure oscillations may vary, and a particular phase relationship should not be implied from any figure.

FIG. 1B shows one possible displacement profile illustrating the axial oscillation of the driven end walls 14, 21 of the cavities 16, 23. The solid curved line and arrows represent the displacement of the driven end walls 14, 21 at one point in time, and the dashed curved line represents the displacement of the driven end walls 14, 21 one half-cycle later. The displacement as shown in this figure and the other figures is exaggerated. Because the actuator 40 is not rigidly mounted at its perimeter, but rather suspended by the isolator 30, the actuator 40 is free to oscillate about its centre of mass in its fundamental mode. In this fundamental mode, the amplitude of the displacement oscillations of the actuator 40 is substantially zero at an annular displacement node 47 located between the centre of the end walls 14, 21 and the corresponding side walls 15, 22. The amplitudes of the displacement oscillations at other points on the end walls 14, 21 have amplitudes greater than zero as represented by the vertical arrows. A central displacement anti-node 48 exists near the centre of the actuator 40 and peripheral displacement anti-node 49 exists near the perimeter of the actuator 40.

FIG. 1C shows one possible pressure oscillation profile illustrating the pressure oscillations within the cavities 16, 23 resulting from the axial displacement oscillations shown in FIG. 1B. The solid curved line and arrows represent the pressure at one point in time, and the dashed curved line represents the pressure one half-cycle later. In this mode and higher-order modes, the amplitude of the pressure oscillations has a central pressure anti-node 58 near the centre of the cavities 16, 23 and a peripheral pressure anti-node 59 near the side walls 15, 22 of the cavities 16, 23. The amplitude of the pressure oscillations is substantially zero at the annular pressure node 57 between the pressure anti-nodes 58 and 59. For a cylindrical cavity the radial dependence of the amplitude of the pressure oscillations in the cavities 16, 23 may be approximated by a Bessel function of the first kind. The pressure oscillations described above result from the radial movement of the fluid in the cavities 16, 23, and so will be referred to as radial pressure oscillations of the fluid within the cavities 16, 23 as distinguished from the axial displacement oscillations of the actuator 40.

With reference to FIGS. 1B and 1C, it can be seen that the radial dependence of the amplitude of the axial displacement oscillations of the actuator 40 (the mode-shape of the actuator 40) should approximate a Bessel function of the first kind so as to match more closely the radial dependence of the amplitude of the desired pressure oscillations in the cavities 16, 23 (the mode-shape of the pressure oscillation). By not rigidly mounting the actuator 40 at its perimeter and allowing it to vibrate more freely about its centre of mass, the mode-shape of the displacement oscillations substantially matches the mode-shape of the pressure oscillations in the cavities 16, 23, thus achieving mode-shape matching or, more simply, mode-matching. Although the mode-matching may not always be perfect in this respect, the axial displacement oscillations of the actuator 40 and the corresponding pressure oscillations in the cavities 16, 23 have substantially the same relative phase across the full surface of the actuator 40 wherein the radial position of the annular pressure node 57 of the pressure oscillations in the cavities 16, 23 and the radial position of the annular displacement node 47 of the axial displacement oscillations of actuator 40 are substantially coincident.

The speed of sound in the fluid in each cavity may vary with temperature and thus the resonant frequency of each cavity may also vary with temperature. It may therefore be preferable to arrange for the two cavities to be of different diameters such that each cavity performs optimally at a different temperature. In this way the performance of the pump as a whole may be made more consistent as a function of temperature, providing a wider useful operating temperature range.

Figure 2A:
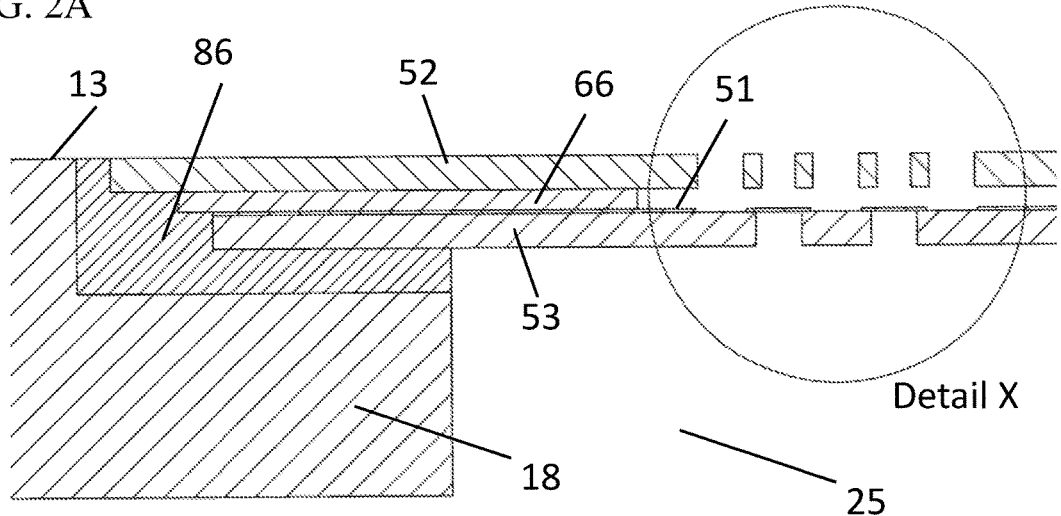
FIG. 2A shows a cross-section view of a valve for use with pumps according to the invention.
Figure 2B:
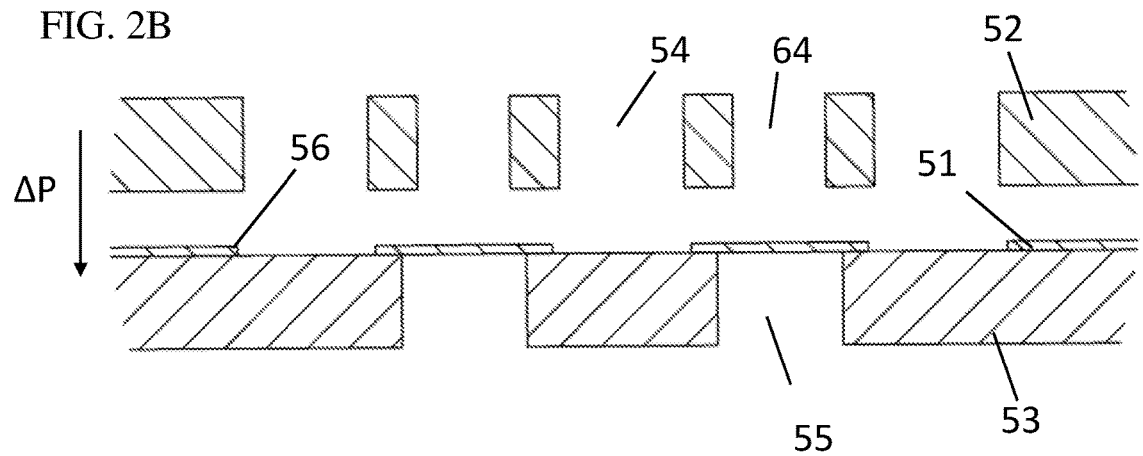
FIGS. 2B, 2C, and 2D show a section of the valve of FIG. 2A in operation.
Figure 2C:
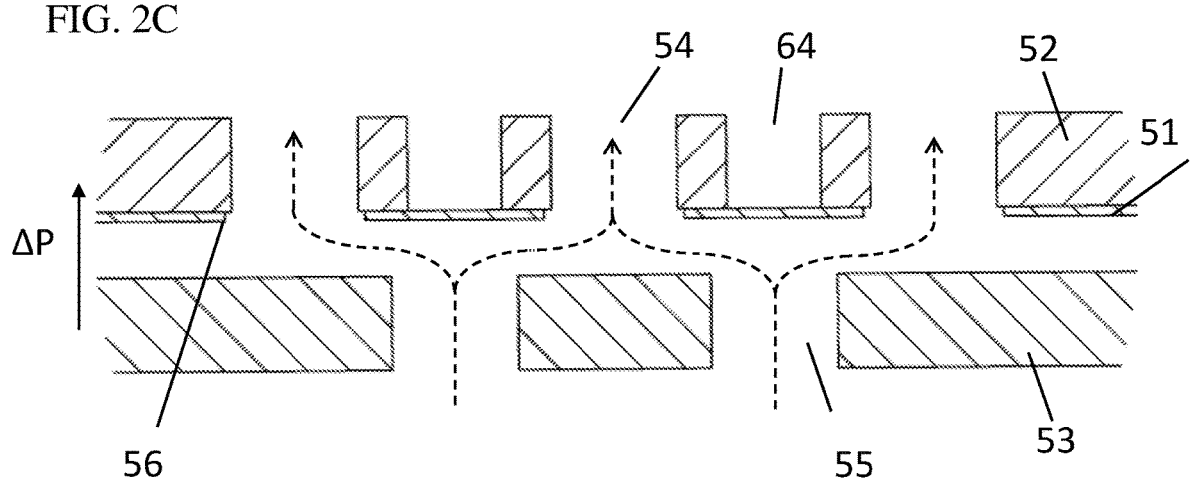
Figure 2D:
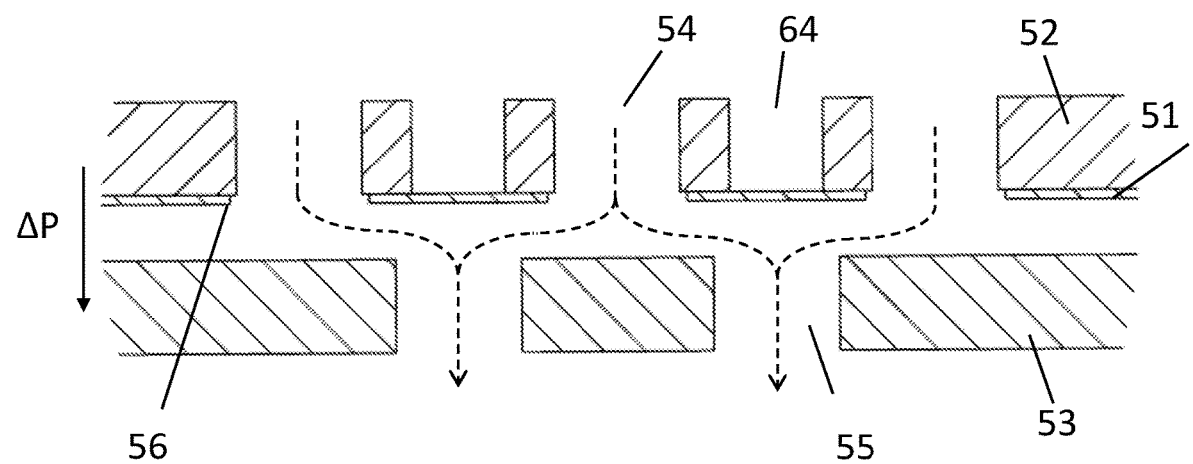

Referring more specifically to FIG. 2A, a schematic cross-section view of a flap valve 50 is shown mounted within the aperture 25. FIGS. 2B, 2C, and D show a more detailed view of Detail X indicated in FIG. 2A at different times during the operation of the valve. The flap valve 50 comprises a flap 51 disposed between a retention plate 52 and a sealing plate 53. The retention plate 52 and the sealing plate are separated by a spacer plate 66. The flap valve is shown held between the sealing plate 53 and the spacer plate 66, although it could be held between the retention plate 52 and the spacer plate 66, or in some other way located in a substantially fixed in-plane position between the retention plate 52 and sealing plate 53 and movable between the retention plate 52 and sealing plate 53. The flap 51 rests against the sealing plate 53 in a closed position which seals the flap valve 50 when not in use, i.e., the flap valve 50 is normally closed. The valve 50 is mounted within the aperture 25 using space-filling adhesive 86 so that the upper surface of the retention plate 52 is substantially flush with the end wall 13 in order to maintain the resonant quality of the cavity. The retention plate 52 and the sealing plate 53 both have apertures 54 and 55 respectively that extend from one side of the plate to the other. The flap 51 also has apertures 56 that are generally aligned with the apertures 54 of the retention plate 52 to provide a passage through which fluid may flow as indicated by the dashed arrows in FIG. 2C. However, as can be seen in the FIGS. 2A to 2E, the apertures 54 of the retention plate 52 and the apertures 56 of the flap 51 are not in alignment with the apertures 55 of the sealing plate 53. The apertures 55 of the sealing plate 53 are blocked by the flap 51 when the flap 51 is in the closed position as shown in FIG. 2B so that fluid cannot flow through the flap valve 50. The retention plate 52 may also have secondary apertures 64 which are not aligned with the apertures 56 in the flap 51 to aid movement of the flap 51 by the differential pressure indicated by ΔP in FIGS. 2B, 2C, and 2D.

Figure 2E:
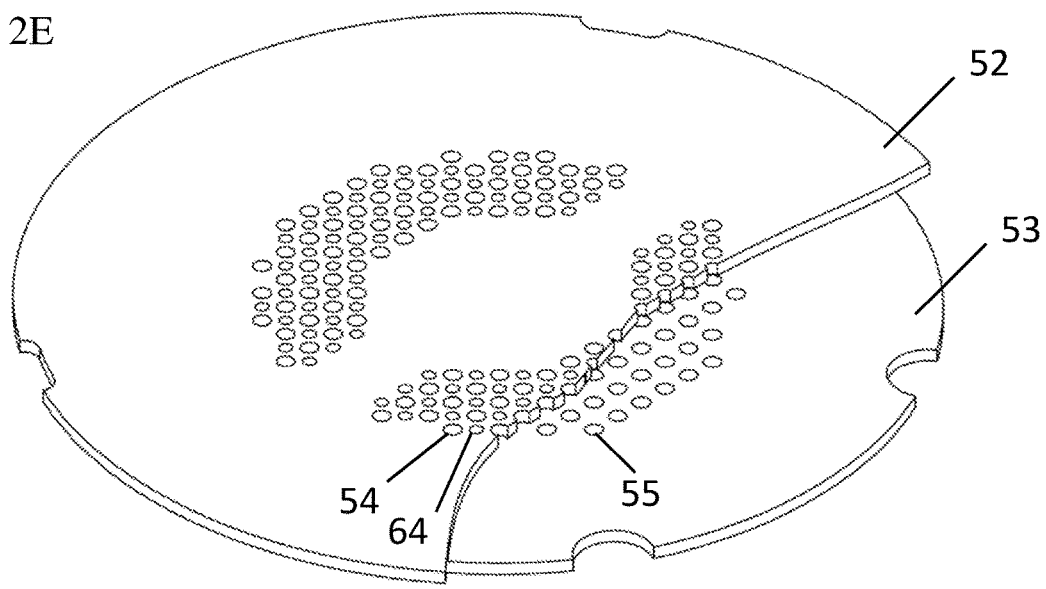
FIG. 2E shows a partial isometric view of the valve of FIG. 2A.

The operation of the flap valve 50 is a function of the differential pressure (ΔP) of the fluid across the flap valve 50. In FIG. 2B, the differential pressure has been assigned a negative value (−ΔP) as indicated by the downward pointing arrow. This negative differential pressure (−ΔP) drives the flap 51 into the fully closed position as described above wherein the flap 51 is sealed against the sealing plate 53 to block the apertures 55 and prevent the flow of fluid through the flap valve 50. When the differential pressure across the flap valve 50 reverses to become a positive differential pressure (+ΔP) as indicated by the upward pointing arrow in FIG. 2C, the flap 51 is motivated away from the sealing plate 53 and against the retention plate 52 into an open position. In this position, the movement of the flap 51 unblocks the apertures 55 of the sealing plate 53 so that fluid is permitted to flow through apertures 55 and then through the aligned apertures 56 of the flap 51 and 54 of the retention plate 52 as indicated by the dashed arrows. When the differential pressure changes back to a negative differential pressure (−ΔP) as indicated by the downward pointing arrow in FIG. 2D, fluid begins flowing in the opposite direction through the flap valve 50 as indicated by the dashed arrows which forces the flap 51 back toward the closed position shown in FIG. 2B. The second apertures 64 in the retention plate 52 ensure the differential pressure is applied to the flap 51 even when in contact with the retention plate 52. Thus, the changing differential pressure cycles the flap valve 50 between closed and open positions to block the flow of fluid after closing the flap 51 when the differential pressure changes from a positive to a negative value. It should be understood that flap 51 could be biased against the retention plate 52 in an open position when the flap valve 50 is not in use depending upon the application of the flap valve 50, i.e., the flap valve would then be normally open. The sizes and shapes of the apertures 54, 55, 56 and 64 are for illustrative purposes only and can be any size or shape and may be the same or different sizes or shapes from one another. The pattern of apertures 54, 55, 56 and 64 may be regular or irregular and may be the same of different from one another. FIG. 2E shows an isometric view of one particular arrangement of the aperture patterns.

Referring to FIG. 3, the pump 10 of FIG. 1 is shown with several alternative configurations of apertures. FIG. 3A shows the pump 10 of FIG. 1 in schematic form, indicating the locations of the inlet apertures 27 and 28 and outlet apertures 25 and 26 of the two cavities 16 and 23, together with the valves 35 and 36 located in the apertures 25 and 26 respectively.

FIG. 3B shows an alternative configuration in which the valves 35' and 36' in the primary apertures 25 and 26 of pump 60 are reversed so that the fluid is drawn into the cavities 16 and 23 through the primary apertures 25 and 26 and expelled out of the cavities 16 and 23 through the secondary apertures 27 and 28 as indicated by the arrows, thereby providing suction or a source of reduced pressure at the primary apertures 25 and 26. As used herein, the term reduced pressure generally refers to a pressure less than the ambient pressure where the pump 10 is located. Although the terms vacuum and negative pressure may be used to describe the reduced pressure, the actual pressure reduction may be significantly less than the pressure reduction normally associated with a complete vacuum. The pressure is negative in the sense that it is a gauge pressure, i.e., the pressure is reduced below ambient atmospheric pressure. Unless otherwise indicated, values of pressure stated herein are gauge pressures. References to increases in reduced pressure typically refer to a decrease in absolute pressure, while decreases in reduced pressure typically refer to an increase in absolute pressure.

In each of the two-cavity pumps described in FIGS. 3A and 3B, the two cavities may be considered as separate pumping units, albeit driven by the same actuator and therefore not independently controllable. These two units may be connected in series or parallel to deliver increased pressure or increased flow respectively using an appropriate manifold. Such manifold may be external to the pump construction (using separate tubing or connections), internal to the pump (by being incorporated into the pump body components 11, 12, 18 and 19 to facilitate assembly and to reduce the number of parts required in order to assemble the pump) or directly between cavities (by being incorporated into the actuator 40, isolator 30 or some sections of the pump body components 11, 12, 18 and 19).

FIG. 3C shows an alternative configuration in which one valve 35' in the primary aperture 25 is configured to draw air into the cavity 16, and one valve 36 in the primary aperture 26 is configured to draw air out of the cavity 23. Secondary apertures 27 and 28 are connected via a pneumatic interconnect 31 which is external to the two pump chambers. This configuration provides a method of connecting the two cavities of the pump 61 in series but increases the size of the pump and introduces additional complexity in its manufacture.

FIG. 3D shows an alternative configuration in which one valve 35' in the primary aperture 25 is configured to draw air into the cavity 16, and one valve 36 in the primary aperture 26 is configured to draw air out of the cavity 23. In this configuration, a direct pneumatic interconnect 29 provides the secondary aperture of the cavities 16 and 23 This configuration provides a more convenient method of connecting the two cavities of the pump 62 in series.

FIG. 3E shows an alternative configuration in which one valve 35 in the primary aperture 25 is configured to draw air out of the cavity 16, and one valve 36 in the primary aperture 26 is configured to draw air out of the cavity 23. A single inlet aperture 27 is provided into the cavity 16, and a direct pneumatic interconnect 29 is provided between the cavities 16 and 23. This provides a convenient method of connecting the two cavities of the pump 63 in parallel. Preferably a single pneumatic connection such as a spigot or barbed connector is provided to the inlet aperture 27 to provide a convenient interface for applications requiring a vacuum pump.

FIG. 3F shows an alternative configuration in which one valve 35' in the primary aperture 25 is configured to draw air into the cavity 16, and one valve 36' in the primary aperture 26 is configured to draw air into the cavity 23. A single outlet aperture 27 is provided to the cavity 16, and a direct pneumatic interconnect 29 is provided between the cavities 16 and 23. This provides a convenient method of connecting the two cavities of the pump 63 in parallel. Preferably a single pneumatic connection such as a spigot or barbed connector is provided to the outlet aperture 27 to provide a convenient interface for applications requiring a positive pressure pump. In this case it may be desirable for individual filters to be attached to the pump in order to filter the air entering via the primary apertures 25 and 26.

Figure 4A:
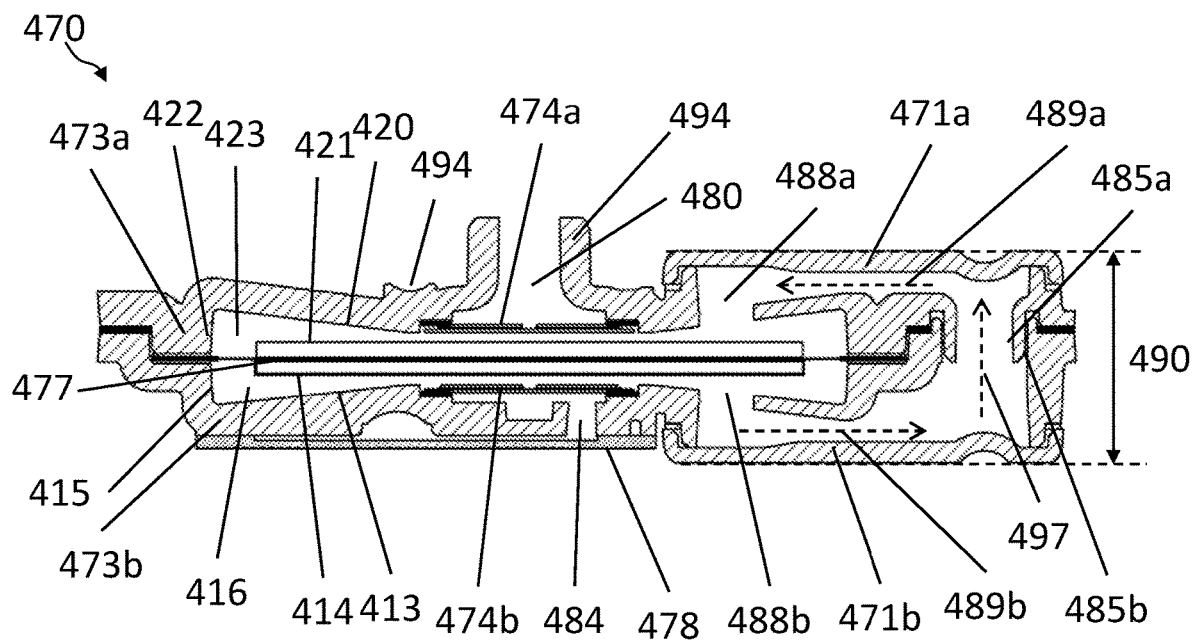
FIG. 4A shows a schematic cross section of a two-cavity pump having an external pneumatic interconnect.

Referring now to FIG. 4A, a pump 470 is shown according to the present disclosure. The pump 470 is substantially similar in configuration to the pump 61 of FIG. 3C.

The pump 470 is formed from the following components: an upper pump body 473a bonded to an upper cap 471a; a lower pump body 473b bonded to a lower cap 471b; a combined actuator and isolator 477 which is held between the upper pump body 473a and the lower pump body 473b; an upper valve 474a bonded into a primary aperture in the upper pump body 473a, located approximately at the centre of the end wall 420 of the upper cavity 423 and configured to draw air out of the upper cavity 423 towards the pump outlet 480; a lower valve 474b bonded into a primary aperture in the lower pump body 473b, located approximately at the centre of the end wall 413 of the lower cavity 416 and configured to draw air into the lower cavity 416 from the pump inlet 484; a filter membrane 478 covering the pump inlet 484.

The construction described above forms an upper cavity 423 defined by the space enclosed by the end walls 420 and 421 and the side wall 422, and a lower cavity 416 defined by the space enclosed by the end walls 413 and 414 and the side wall 415.

The end walls 420 and 413 formed by the internal surfaces of the pump bodies 473a and 473b are frusto-conical in shape. Consequently, the heights of the cavities 423 and 416 vary from larger heights at the side walls 422 and 415 to smaller heights at the centres of the end walls 420, 413. The frusto-conical shape of the end walls 420 and 413 intensifies the pressure at the centre of the cavities 423, 416 (where the heights of the cavities 423, 416 are smaller) relative to the pressure at the side walls 422, 415 of the cavities 423, 416 (where the heights of the cavities are larger). Therefore, comparing cylindrical cavities 23, 16 shown in FIG. 1 with the frusto-conical cavities 423, 416 shown in FIG. 4 under conditions of equal central pressure amplitudes, it is apparent that frusto-conical cavities 423, 416 will generally have a smaller pressure amplitude at positions away from the centre of the cavities: the increasing height of the cavities acts to reduce the amplitude of the pressure wave. As the viscous and thermal energy losses experienced during the oscillations of the fluid in the cavities both increase with the amplitude of such oscillations, it is advantageous to the efficiency of the pump 470 to reduce the amplitude of the pressure oscillations away from the centre of the cavities 423, 416 by employing a frusto-conical cavity design.

Preferably, the heights of the two cavities at the centres of the end walls 420, 413 is between 50 μm and 1 mm, the heights of the two cavities at the side walls 422, 415 is between 100 μm and 3 mm, and the diameter of the cavities defined by the side walls 422, 415 is between 12 mm and 26 mm. In such a case the cavity may support a pressure standing wave frequency in a gas of between 15 kHz and 35 kHz. More preferably, the heights of the cavities at the centres of the end walls 420, 413 is between 100 μm and 500 μm, the heights of the cavities at the side walls 422, 415 is between 1 mm and 2 mm, and the diameters of the cavities defined by the side walls 422, 415 is between 16 mm and 24 mm. In such a case the cavity may support a pressure standing wave frequency in air of around 21 kHz.

The pump 470 of FIG. 4A provides a pneumatic interconnect which allows fluid to flow from the upper cavity 423 to the lower cavity 416 and is formed from: a lower secondary aperture 488b located in the end wall 420; a lower radial channel 489b formed between the lower cap 471b and the lower pump body 473b; an axial flow channel 497 formed by the upper pneumatic interconnect 485a of the upper pump body 473a and the lower pneumatic interconnect 485b of the lower pump body 473b; an upper radial channel 489a formed between the lower cap 471a and the upper pump body 473a; an upper secondary aperture 488a located in the end wall 413.

The positions of the upper and lower secondary apertures 488a, 488b are preferably located at a radial distance (r) from the centre of the end walls 413, 420, where (r) is between approximately 0.43a and 0.83a, and more preferably close to 0.63a, i.e., close to the nodal points of the pressure oscillations as shown in FIG. 1C.

In operation the pump draws air through the filter membrane 478, through the lower valve 474b, through the lower secondary aperture 488b, along the lower radial channel 489b, up the axial flow channel 489, along the upper radial channel 489a, through the upper secondary aperture 488b, through the upper valve 474a and out of the pump outlet 480. This provides an acoustic resonance pump with the two cavities 416 and 423 connected in series.

A consideration for the integration of a pump into an end product may be the pump thickness 490 (ignoring outlet connector 494). The pump 470 is designed to minimise this thickness, however it is clear that any external pneumatic connection of the type shown is undesirable in this regard.

Figure 4B:
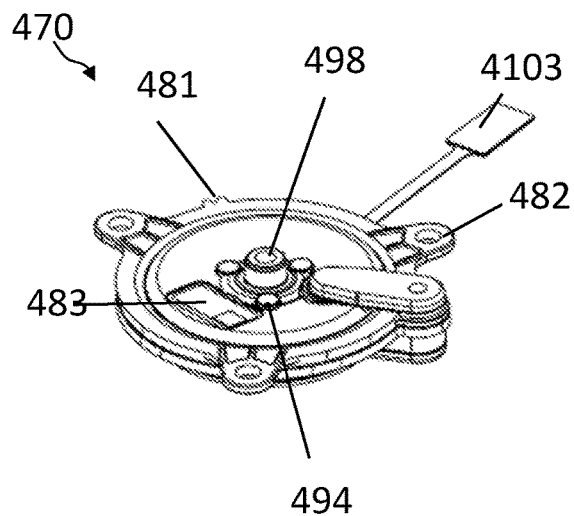
FIGS. 4B and 4C show isometric views of the pump shown in FIG. 4A.
Figure 4C:
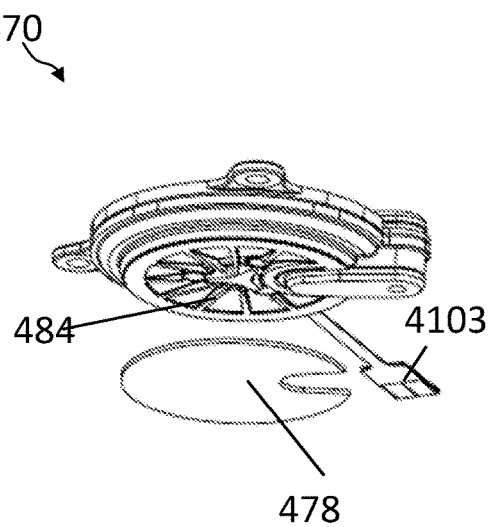
Figure 4D:
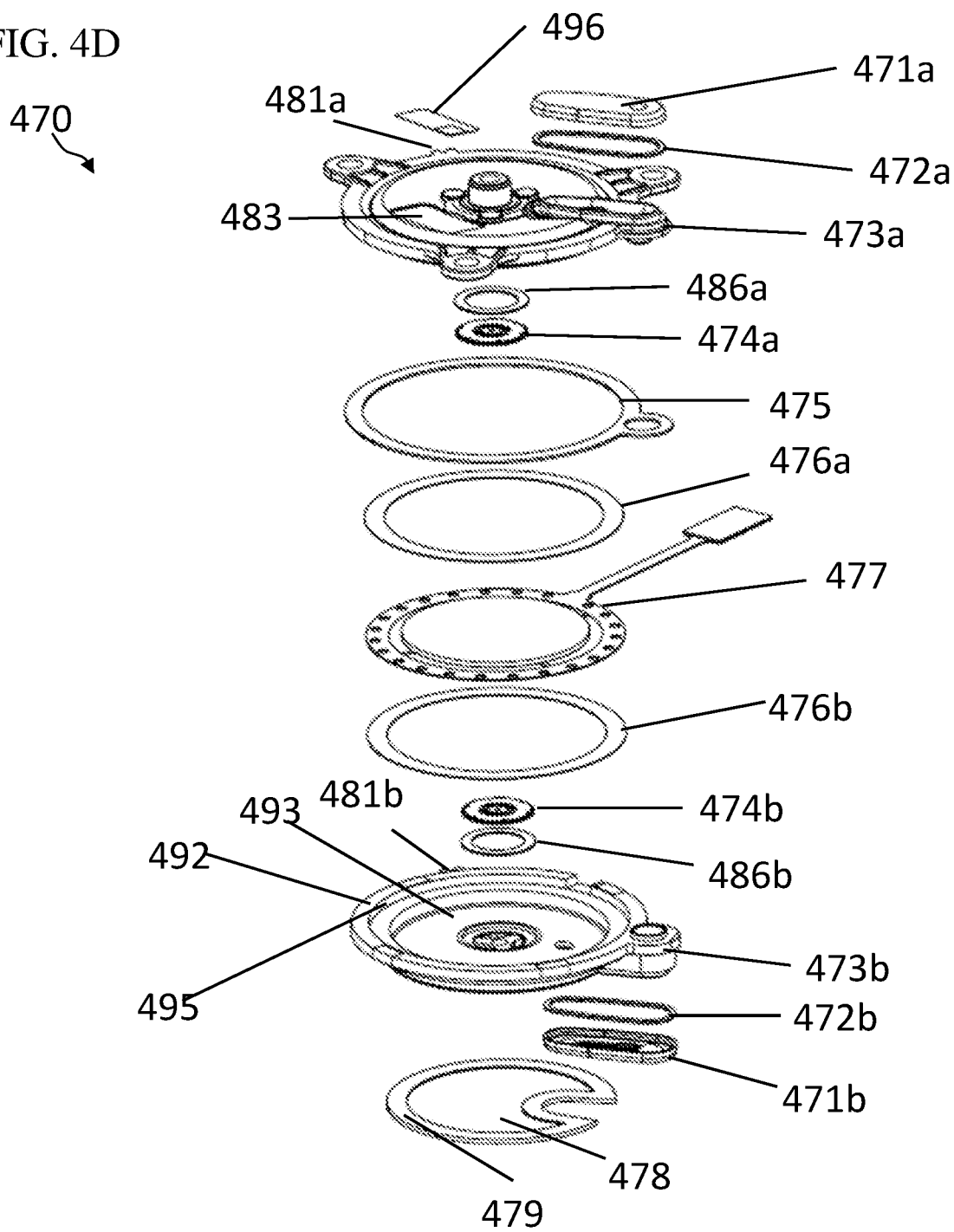
FIG. 4D shows an exploded view of the pump shown in FIG. 4A.

FIG. 4D shows an exploded view of the pump 470 described in FIG. 4A, and along with FIGS. 4B and 4C shows details of the individual components.

The upper cap 471a and lower cap 471b are used to seal the upper cross channel 489a and lower cross channel 489b. These caps may be plastic, metal, semiconductor, ceramic or any other material and may be formed by machining, injection molding, stamping or another process. The caps 471a and 471b may themselves be a sub-assembly of different parts and materials. The caps may be attached to the pump bodies 473a and 473b by gluing, pressure-sensitive adhesive, ultrasonic welding, diffusion bonding, or any other method. In one arrangement the caps 471a, 471b are a thin laminate of plastic sheet and attached to the pump bodies 473a and 473b using pressure-sensitive adhesive. Preferably, the caps 471a, 471b are formed from injection moulded, glass-filled plastic and are attached to the pump bodies 473a and 473b using a UV-curing adhesive.

The upper pump body 473a and lower pump body 473b combine to form the main body of the Pump 470. The pump bodies 473a and 473b may be formed from plastic, metal, semiconductor, ceramic or any other material or composite material and may be formed by machining, injection moulding, stamping or another process. Preferably, the pump bodies 473a, 473b are formed from injection moulded, glass-filled plastic.

The upper pump body 473a and lower Pump body 473b may provide features aiding automated pump assembly, for example alignment feature 481a on the upper pump body 473a and alignment feature 481b on the lower pump body 473b. During assembly these features provide mechanical keying to ensure the rotational alignment of the pump bodies 473a, 473b. A second example is chamfered surfaces 495 on the mating surfaces of the pump bodies 473a, 473b. The upper pump body 473a and lower Pump body 473b may provide features aiding integration and identification of the pump. These may include a recess 483 for locating and recessing an identification label 496, pump mounting features 482, and a shaped spigot 498 at the pump outlet for connection of the pump to the pneumatic circuit.

The upper pump body 473a and lower pump body 473b may provide features aiding injection moulding. These may include multiple injection gates 494 placed close to the centre of the bodies 473a, 473b to aid the flow of material during moulding. The injection gates 494 may be designed to be sub-flush to the surface of the pump bodies 473a, 473b to prevent gating defects leading to increased pump thickness.

The surfaces of the pump bodies 473a and 473b may be rough textured 492 in selective regions where any of the adhesive beads 472a, 472b, 475, 486a, 486b, or 476 bond to the pump bodies 473a, 473b to improve adhesion, or in other regions for visual contrast, grip, adhesion or another purpose.

The surfaces of the pump bodies 473a and 473b may be smooth-textured 493 in selective regions to provide good sealing to external connections and o-rings (on the outlet spigot 498 for example), to reduce viscous drag in regions of high air flow, such as within the pumping cavity, or to provide good adhesion for pressure sensitive adhesives (on the label recess 483 for example), or for another purpose.

Figure 5A:
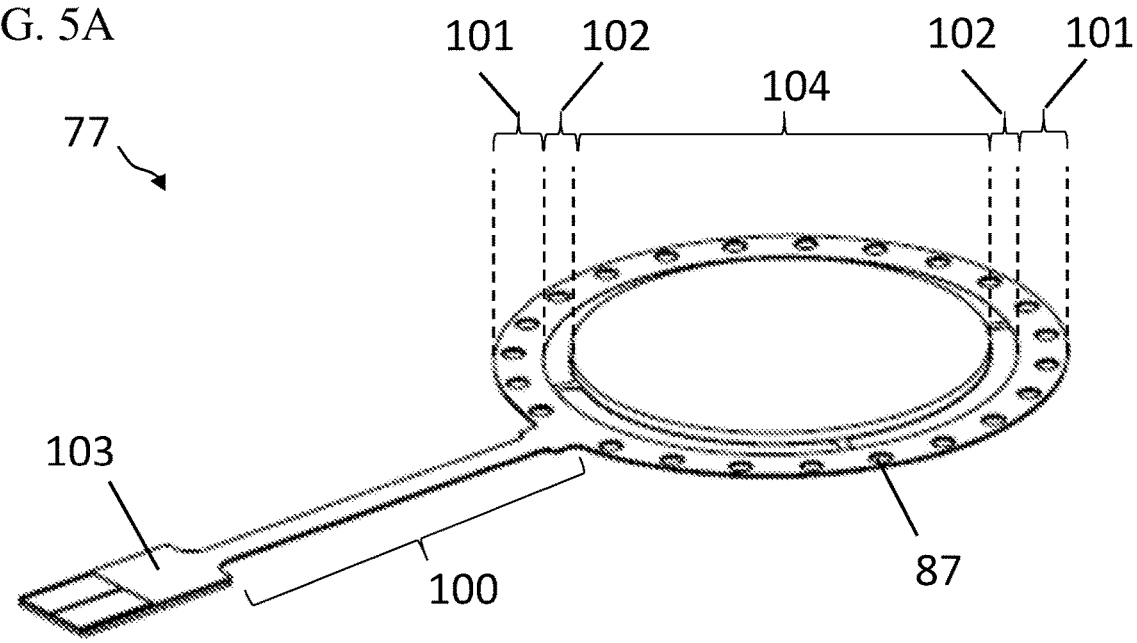
FIG. 5A shows an isometric view of a combined actuator and isolator which may be used in the pump of FIG. 4A.
Figure 5B:
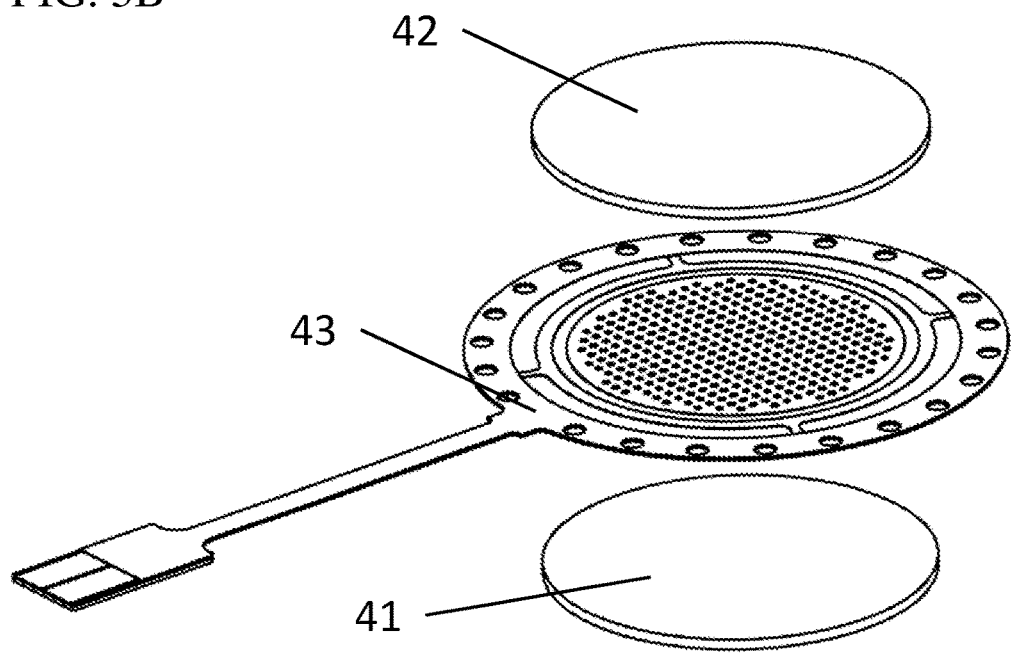
FIG. 5B shows an exploded view of the combined actuator and isolator shown in FIG. 5A.
Figure 6A:
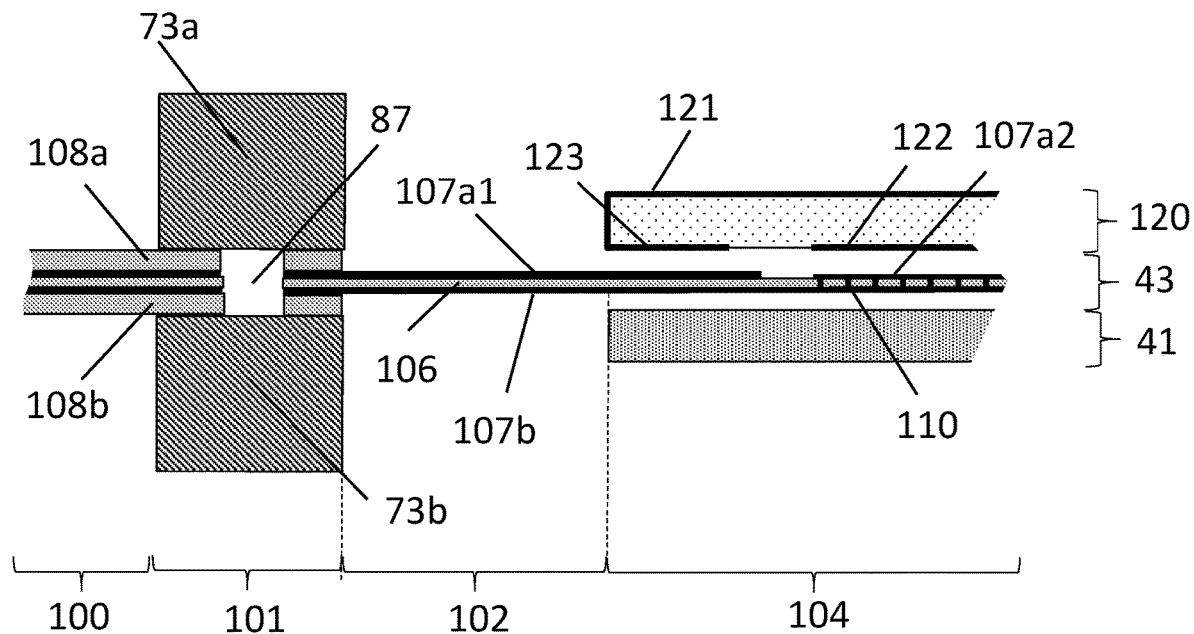
FIG. 6A shows a cross section of the combined actuator and isolator shown in FIG. 5A, and how it interacts with the pump body of the pump shown in FIG. 4A.
Figure 6B:
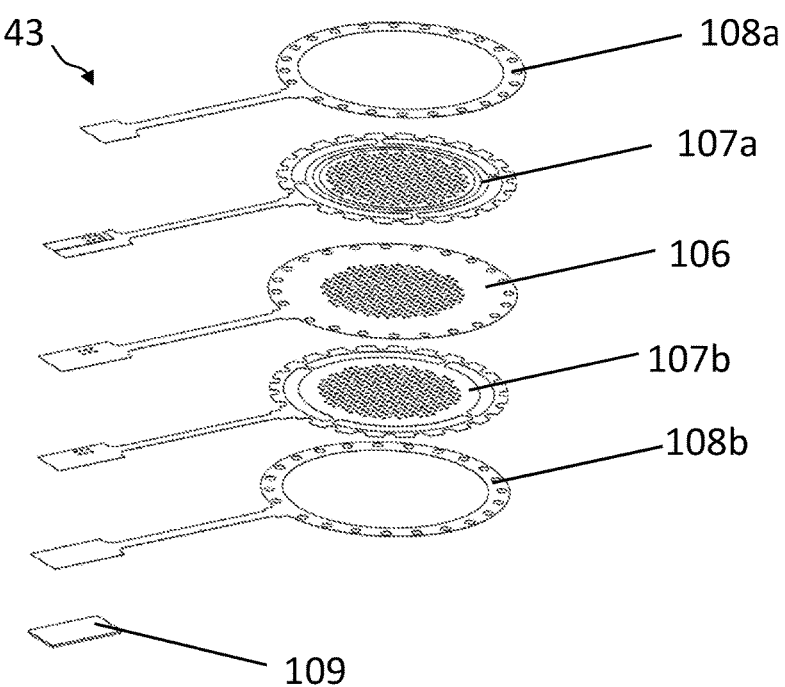
FIG. 6B shows an exploded view of the construction of the flexible circuit used in the actuator shown in FIG. 5A.

The combined actuator and isolator 477 is described further with regards to FIGS. 5, 6 and 7. Preferably, the combined actuator and isolator 477 may be formed from: a piezoelectric disc 42 formed from lead zirconate titanate; an end plate 41 formed from a metal such as aluminium, steel, titanium, or nickel, or alloys such as nickel-iron or molybdenum-copper; a flexible circuit 43 formed from polyimide base material 106 and covering layers 108a, 108b, and conductors 107a, 107b formed from a metal such as copper, beryllium-copper, copper-nickel, or Inconel. It is desirable that the metal end plate 41 has a similar coefficient of thermal expansion to the piezoelectric disc 42, and that the metal conductors 107a, 107b in the flexible circuit 43 are formed from a metal capable of undergoing a high number of mechanical cycles without failure. The piezoelectric disc 42, the flexible circuit 43 and the end plate 41 may be joined by any suitable method including without limitation gluing. Preferably, the piezoelectric disc 42, the flexible circuit 43 and the end plate 41 are joined using a thermal cured epoxy with a high glass transition temperature.

The valves 474a and 474b may be any high frequency valve of suitable response time and open flow restriction. Preferably, the valves 474a and 474b are made of a laminate construction of metal and plastic layers as disclosed herein, and further described in Patent Applications WO2010/139917, PCT/GB2019/053458 and PCT/GB2019/053459.

The filter 478 prevents particles entering the pump via the pump inlet, which may potentially cause damage to the valves 474a, 474b. The filter 478 may be a sheet filter, depth filter, active filter or any other sort of filter. The filter 478 may be made from plastic, metal, semiconductor or any other material. The filter 478 may be formed from an PTFE membrane supported on a polyester or polypropylene non-woven supporting layer. Alternatively the filter 478 is formed from an acrylic copolymer matrix formed around a nylon non-woven supporting layer. In both of these cases the filter 478 has a thickness of less than 1.0 mm and an effective pore size of less than 10 um.

Referring to FIG. 4C, the components of the pump 470 may be joined and pneumatically sealed by a number of adhesive beads: the cap adhesive beads 471a and 471b which join and pneumatically seal the caps 471a, 471b to the pump bodies 473a, 473b; the pump adhesive bead 475 which joins and pneumatically seals the pump bodies 473a, 473b; the flexible circuit adhesive bead 476 which joins and pneumatically seals the combined actuator and isolator 477 to the pump bodies 473a, 473b; the valve adhesive beads 486a and 486b which join and pneumatically seal the valves 474a, 474b to the pump bodies 473a, 473b; and the filter adhesive bead 479 which joins and pneumatically seals the filter 478 to the lower pump body 473b. The adhesive beads may be formed of the same or different materials from one another. The adhesive beads may be formed from adhesive with properties specifically selected to be hard, soft, brittle, or compliant. The adhesive beads may be formed by a UV curing adhesive. The filter adhesive bead 479 may comprise multiple, discrete beads across the filter 478 providing multiple bonding locations and therefore good support of the filter 478. Preferably the filter adhesive bead 479 comprises a ring-shaped bead applied at the edge of the filter 478 and a discrete bead close to the centre.

The function of any of the adhesive beads may be replaced by one or a combination of alternative methods of joining and or sealing. Joining methods may include pressure sensitive adhesive, interference fits, mechanical fixtures such as clips, screws, and clamps, laser welding, electrical welding, solvent welding, diffusion bonding, or any other method. Sealing methods may include pressure sensitive adhesive, gaskets, o-rings, sealing grease, interference fits, or any other method.

The pump 470 described in FIG. 4 includes a combined actuator and isolator 477. With reference to FIG. 1A, the combined actuator and isolator 477 is a subassembly which fulfils the roles of the actuator 40 and the isolator 30, as well as providing other functions to support pump assembly and providing the electrical interface to drive electronics, as now further described.

FIGS. 5A and 5B show a combined actuator and isolator 77 which is equivalent to the combined actuator and isolator 477 shown in FIG. 4. This subassembly is formed from three components: a piezoelectric disc 42, a flexible circuit 43 and an end plate 41. The flexible circuit 43 is sandwiched between the piezoelectric disc 42 and the end plate 41 to form the subassembly. The bonds between the isolator 30, end plate 41 and piezoelectric disc 42 may be formed by any suitable method including without limitation gluing. The combined actuator and isolator 77 has 5 functional regions: the actuator region 104; the isolator region 102; the clamping region 101; the tail region 100; and the electrical connector 103. The tail region 100 provides convenient electrical connection between the actuator region 104 at the centre of the pump 70 and the electrical connector 103 which provides convenient means to connect the pump to an electronic drive circuit.

FIG. 6 shows a cross section of a portion of the pump 70 which shows the actuator region 104, isolator region 102, and clamping region 101 in more detail.

The actuator region 104 includes a piezoelectric disc 120 that has a first actuator electrode 121 on an upper surface and a second actuator electrode 122 on a lower surface. Both the first actuator electrode 121 and second actuator electrode 122 are metal. The first actuator electrode 121 is wrapped around the edge of the piezoelectric disc 120 in at least one location around its circumference to bring a portion of the first actuator electrode 121 onto the lower surface of the piezoelectric disc 120. This wrapped portion of the first actuator electrode 121 is a wrap electrode 123. In operation, a voltage is applied across the first actuator electrode 121 and second actuator electrode 122 resulting in an electric field being set up between the electrodes in a substantially axial direction. The piezoelectric disc 120 is polarized such that the axial electric field causes the piezoelectric disc 120 to expand or contract in a radial direction depending on the polarity of the electric field applied. In operation, no electric field is created between the first actuator electrode 121 and the wrap electrode 123 that extends over a portion of the surface of the piezoelectric disc 120 that opposes the first actuator electrode 121. Thus, the area over which the axial field is created is limited to the area of the piezoelectric disc 120 that does not include the wrap electrode 123. For this reason, the wrap electrode 123 may not extend over a significant part of the lower surface of the piezoelectric disc 120.

Referring again to FIG. 6, the flexible circuit 43 in the actuator region 104 is comprised of a flexible, electrically non-conductive flexible circuit substrate 106 with conductive electrodes 107a, 107b on its upper and lower surfaces. The substrate 106 may be formed of a polyester (PET), polyimide (PI), polyethylene napthalate, (PEN), polyetherimide (PEI), or any material with similar mechanical and electrical properties. The conductive electrode layers may be formed of copper, beryllium-copper, copper-nickel, Inconel or any other conducting material and may be applied to the core by rolling (with or without an adhesive) or by electrodeposition, or another method. The electrode layers may be patterned by etching. The isolator may include an adhesive which bonds together the core, electrode, and any other layers. Further non-conductive capping layers 108a, 108b (shown in FIG. 6B) may be applied selectively to the isolator to insulate the electrodes and to provide robustness.

The upper surface of the flexible circuit 43 includes two regions of electrically isolated conductor 107a1 and 107a2 and the lower surface of the flexible circuit 43 includes a lower flexible circuit conductor 107b. In some regions of the upper surface of the flexible circuit, one of the upper flexible circuit conductors 107a2 and the lower flexible circuit conductor 107b are connected by one or more electrical vias 110 which pass through the flexible circuit substrate 106.

When joined to the piezoelectric disc 120, the first upper flexible circuit conductor 107a1 connects with the wrap electrode 123 and thereby with the first actuator electrode 121 of the piezoelectric disc 120. The lower flexible circuit conductor 107b connects with the second upper flexible circuit conductor 107a2 and thereby with the second actuator electrode 122 of the piezoelectric disc 120.

Figure 7A:
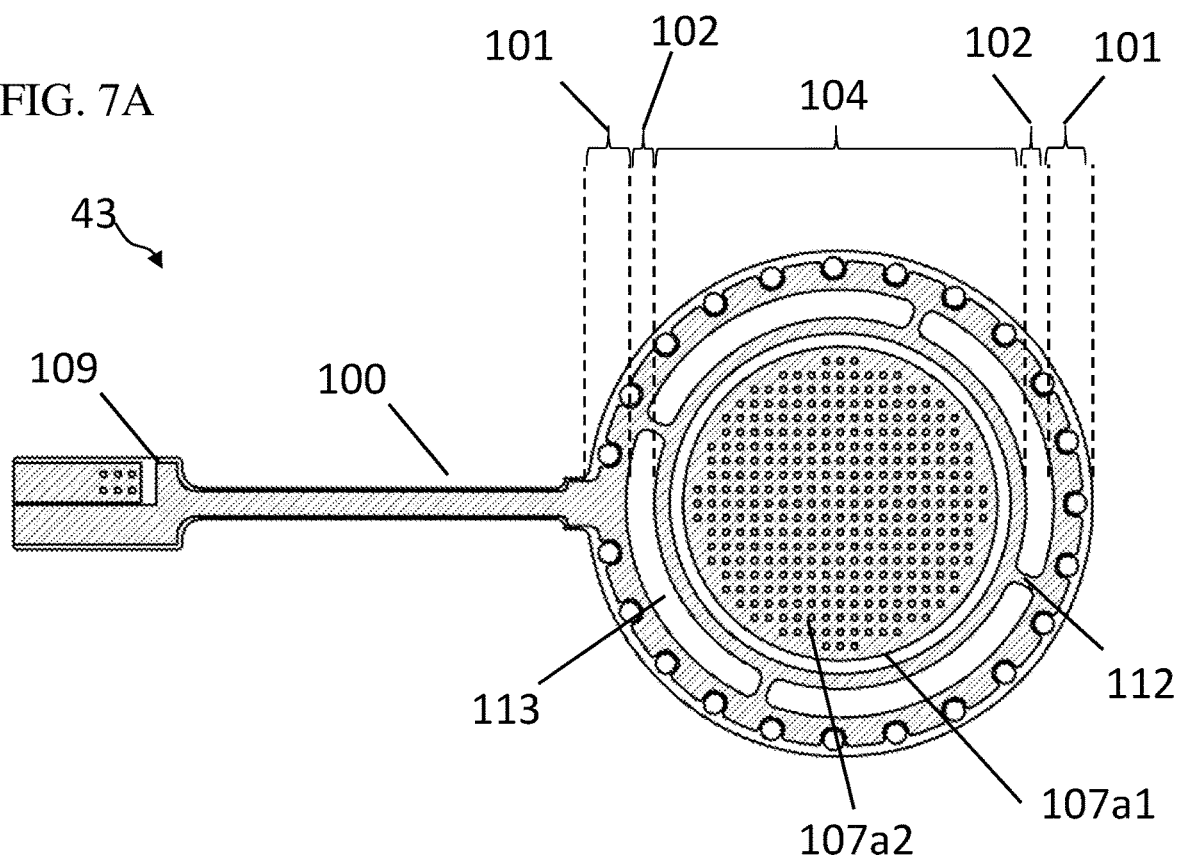
FIGS. 7A and 7B show plan view images of the flexible circuit used in the actuator shown in FIG. 5A.
Figure 7B:
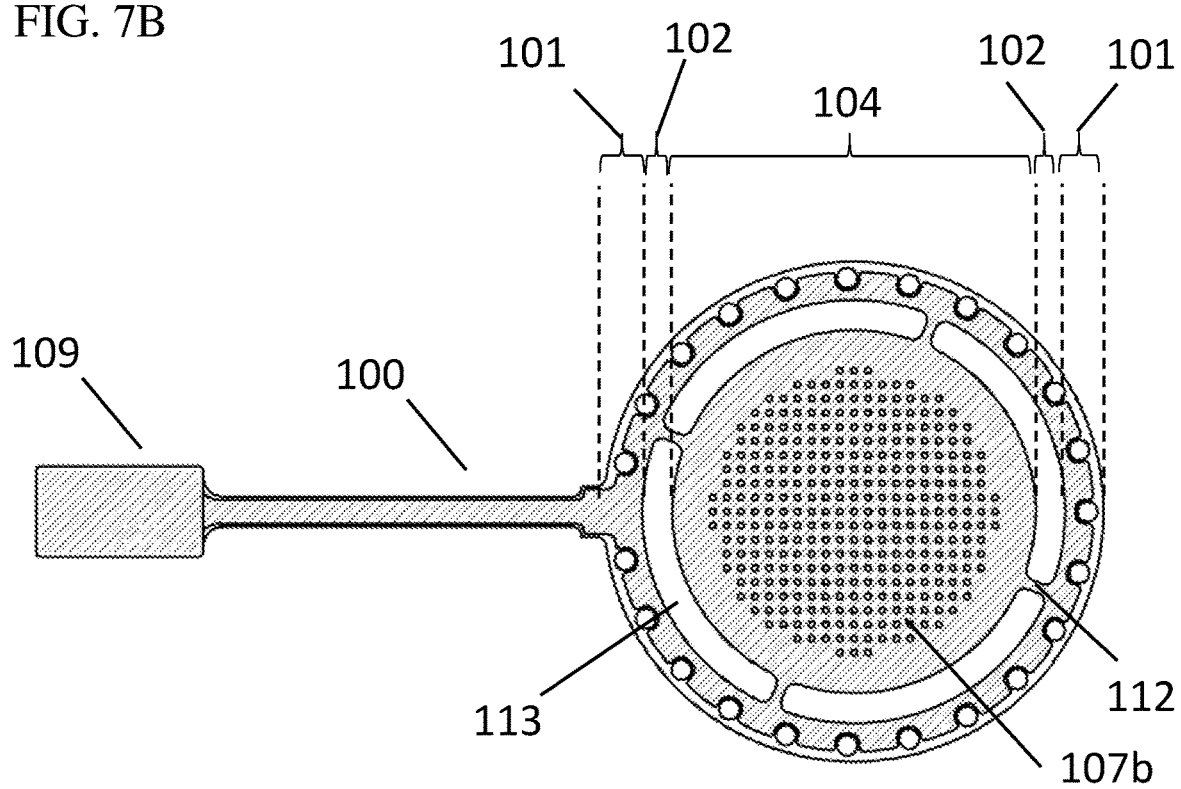

With reference to FIGS. 7A and 7B, the isolator region 102 of the combined actuator and isolator 77 provides vibration isolation between the actuator region 104 and the clamping region 101, as well as providing electrical connections to the actuator. The isolator region 102 is here formed by the flexible circuit 43, with selective regions of the upper flexible circuit conductor 107a1 or lower flexible circuit conductor 107b present (conductor bridges 112) or absent (conductor gaps 113) to provide two electrical connections to the actuator whilst also increasing the flexibility of the combined actuator and isolator 77 in the isolator region 102. In this way the isolator region provides the desired function of supporting the actuator without significantly damping its motion.

The clamping region 101 of the combined actuator and isolator 77 provides a convenient way to join the combined actuator and isolator 77 to the upper pump body 73a and lower pump body 73b. The clamping region 101 of the combined actuator and isolator may be glued, welded, clamped, or otherwise attached to the pump body components 73a, 73b. All such methods are understood to be included in the terms "retained", "bonded", or the like used herein.

FIG. 6 shows how the flexible circuit 43 of a combined actuator and isolator 77 is attached to the pump body components 73a, 73b. With reference to FIGS. 6 and 7, if the clamping region 101 of assembly 77 is not well-constrained where it is attached to the pump body components 73a and 73b it may vibrate against them, leading to the generation of unwanted audible noise. Therefore, where the clamping region 101 of the combined actuator and isolator 77 is glued to the pump body components 73a, 73b it is preferable to ensure that all three components are immobilized with respect to one another.

Assembly of the pump boy components 73a and 73a to the combined actuator and isolator 77 may be achieved by dispensing a bead of adhesive onto one of the pump body components 73a, 73b, placing the combined actuator and isolator 77 onto this bead of adhesive, and then placing the other of the pump body component on top. The assembly may then be pressed together and the adhesive cured to form a rigid bond. However this process has the disadvantage that it is difficult to ensure that the adhesive fully fills the gap between the clamping region 101 of the combined actuator and isolator 77 and both pump body components 73a and 73b, as to do so it must flow around the edge of the isolator region 101. While it is possible to dispense a second adhesive bead, this adds to the complexity of the manufacturing process and is therefore undesirable.

The combined actuator and isolator 77 shown in FIG. 5 circumvents this limitation. The clamping region 101 of the combined actuator and isolator 77 includes a plurality of holes 87 in its periphery. These holes enable the flexible circuit adhesive 76 to flow readily from one side of the clamping region 101 to the other, facilitating assembly and the desirable mitigation of noise. This has the added benefit of providing direct bonding of the upper pump body 73a and the lower pump body 73b through the holes 87, providing increased structural robustness of the assembly, and without relying on the adhesive bonding properties of the materials forming the clamping region 101 of the combined actuator and isolator.

While any type of adhesive may be used to attach the clamping region 101 of the combined actuator and isolator 77 to the pump body components 73a, 73b it is preferable to use an adhesive of low viscosity in order that it can flow easily into any gaps between the clamping region 101 and the pump body components 73a, 73b thereby avoiding the possibility of these parts vibrating against each other. As the primary function of the flexible circuit adhesive 76 is to avoid unwanted audible noise and to form a pneumatic seal, it may be appropriate to use an adhesive with a low stiffness or elastomeric properties. Further, for reasons of convenience, a so-called UV-curing adhesive is preferable as it enables the curing process to be well-controlled.

Alternatively, the clamping region 101 may include other features to aid assembly and sealing, including an integrated gasket which may be formed of a soft material such as silicone to replace the flexible circuit adhesive 76, or a stiffener to prevent distortion of the combined actuator and isolator 77 when it is clamped between potentially non-planar moulded pump body components.

As can be seen in FIG. 4A, the thickness 490 of the pump 470 is limited by the requirement to attach upper and lower caps 471a, 471b to form the pneumatic interconnect 431. More compact pumps than that shown in FIG. 4A can be achieved by alternative constructions using, for example, laminate constructions of thin metal, plastic or other materials, however the requirement for the pneumatic interconnect always adds unwanted thickness and additional components to the pump.

An alternative method, illustrated schematically in FIG. 3E, is to provide a direct pneumatic interconnect 32 between the upper cavity 23 and lower cavity 16. FIG. 8 illustrates three methods for forming a direct pneumatic interconnect 32.

Figure 8A:
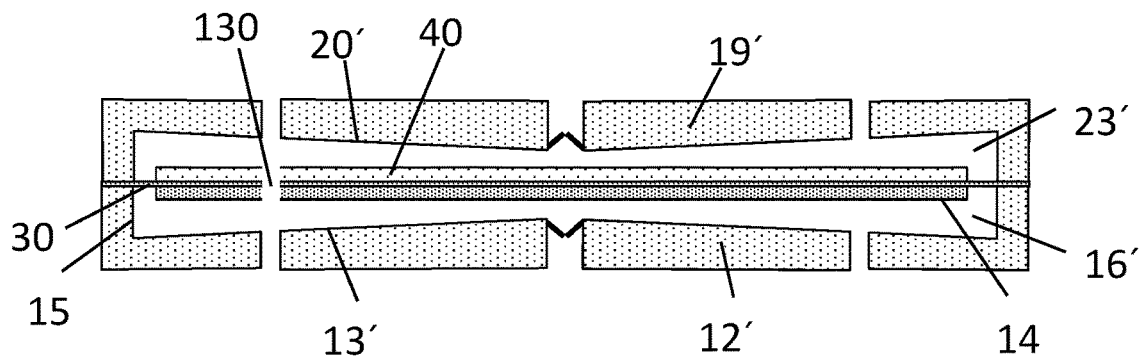
FIGS. 8A, 8B and 8C show schematic cross sections of methods of providing a direct pneumatic interconnect between the cavities of a two-cavity pump, according to the invention.

FIG. 8A shows an embodiment in which a direct pneumatic interconnect is provided by one or more apertures 130 in the actuator 40. The apertures 130 in the actuator 40 may be formed before or after assembly of the actuator 40. The apertures may be circular, oblong, elliptical, rounded oblong, or any other shape and may be located at any position in the actuator 40. Methods of forming apertures 130 are described in more detail with regards to FIG. 10.

Figure 8B:
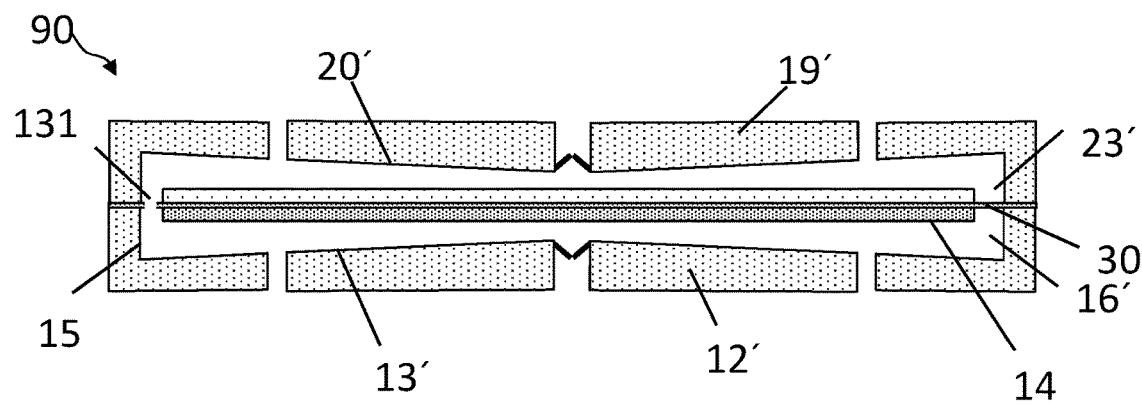
Figure 11A:
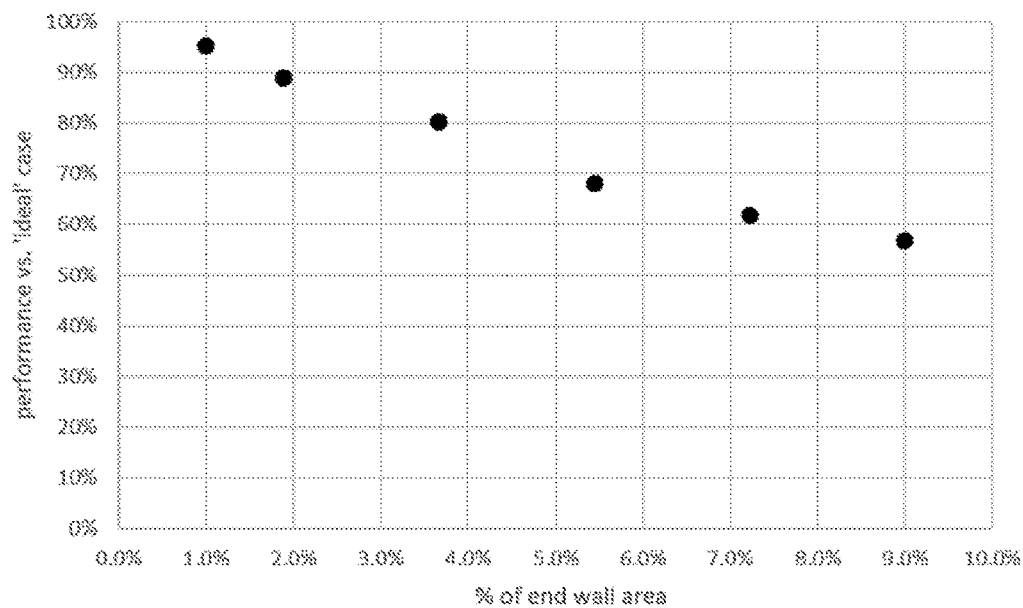
FIG. 11A shows experimental data showing the effect on pump performance of providing a pneumatic interconnect located away from a pressure oscillation node.

FIG. 8B shows an embodiment in which a direct pneumatic interconnect is provided by one or more apertures 131 in the isolator 30. The apertures 131 may be circular, oblong, elliptical, rounded oblong, or any other shape and may be located at any position in the isolator 30. Methods of forming apertures 131 are described in more detail with regards to FIGS. 11 and 12.

Figure 8C:
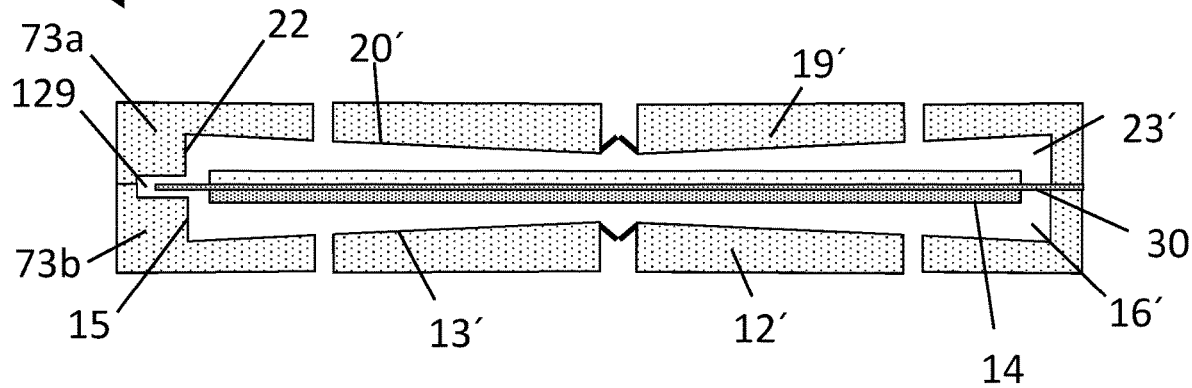

FIG. 8C shows an embodiment in which a direct pneumatic interconnect is provided by an air path 129 provided around or through the isolator 131 and radially outwards of the side walls 15, 22. The air path may be provided by: holes, slots, or grooves formed in the upper pump body 73a and lower pump body 73b; holes, slots, or grooves formed in the clamped section of the isolator 30; the presence of additional components whose function is to provide a gap between the pump bodies 73a, 73b and the isolator; or any combination of these methods. There may be single or multiple air paths.

As discussed with regard to FIG. 1A, it is preferable to have a high degree of matching between the mode-shape of the actuator (FIG. 1B) and the mode-shape of the pressure standing wave (FIG. 1C). This means that the radial position of the node of the actuator motion 47 should be close to the radial position of the node of the pressure standing wave 57, as preferred. As also discussed, it is preferable that any unvalved aperture 27 in the cavity should be provided close to the node of the pressure standing wave 57 to avoid unwanted disruption to the resonance of the pressure standing wave. These constraints together mean that achieving efficient pump performance requires a direct pneumatic interconnect to be formed through the actuator, as illustrated in FIG. 8A.

Figure 9A:
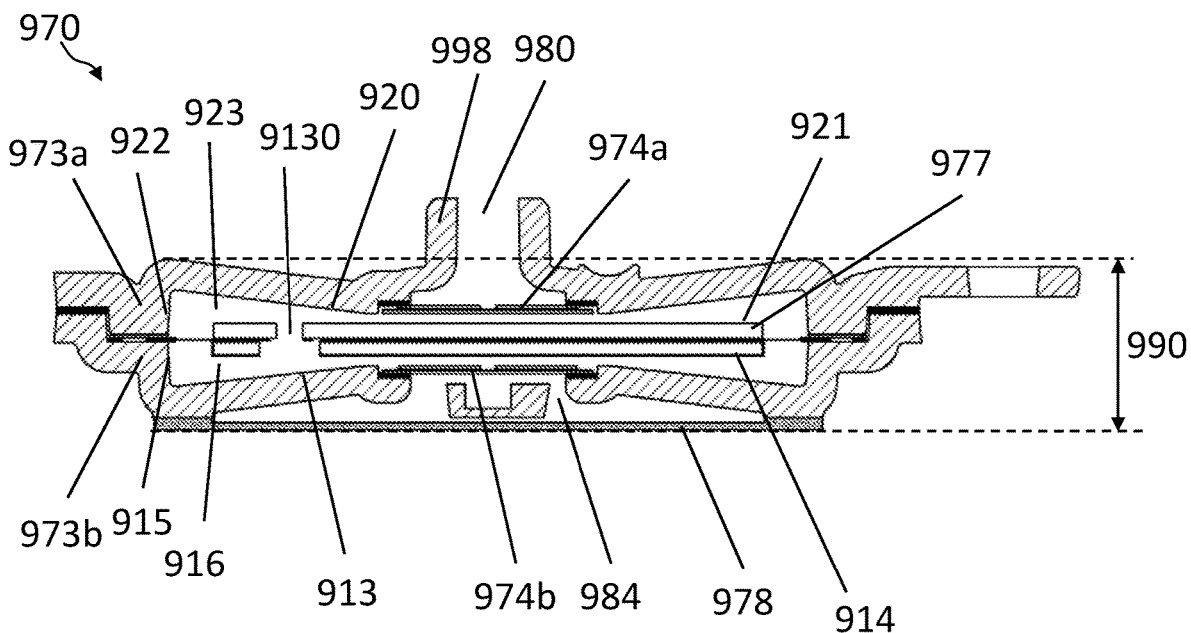
FIG. 9A shows a schematic cross section of a two-cavity pump which includes a direct pneumatic interconnect.

Referring now to FIG. 9A, a pump 970 according to one illustrative embodiment of the present invention is shown. The pump 970 is substantially similar in configuration to the pump 62 of FIG. 3D and provides a direct pneumatic interconnect through the actuator.

The pump 970 is formed from the following components; an upper pump body 973a; a lower pump body 973b; a combined actuator and isolator 977 with an aperture 9130, which is held between the upper pump body 973a and the lower pump body 973b; an upper valve 974a bonded into a primary aperture in the upper pump body 973a, located approximately at the centre of the end wall 920 of the upper cavity 923 and configured to draw air out of the upper cavity 923 towards the pump outlet 980; a lower valve 974b bonded into a primary aperture in the lower pump body 973b, located approximately at the centre of the end wall 913 of the lower cavity 916 and configured to draw air into the lower cavity 916 from the pump inlet 984; a filter membrane 978 covering the pump inlet 984.

The construction described above forms an upper cavity 923 defined by the space enclosed by the end walls 920 and 921 and the side wall 922, and a lower cavity 916 defined by the space enclosed by the end walls 913 and 914 and the side wall 915.

The end walls 920 and 913 formed by the internal surfaces of the pump bodies 973a and 973b are frusto-conical in shape. Consequently, the heights of the cavities 923 and 916 vary from larger heights at the side walls 922 and 915 to smaller heights at the centres of the end walls 920, 913. The frusto-conical shape of the end walls 920 and 913 intensifies the pressure at the centre of the cavities 923, 916 (where the height of the cavities 923, 916 are smaller) relative to the pressure at the side walls 922, 915 of the cavities 923, 916 (where the heights of the cavities are larger).

In a preferred embodiment, the heights of the two cavities at the centres of the end walls 920, 913 is between 50 μm and 1 mm, the heights of the two cavities at the side walls 922, 915 is between 100 μm and 3 mm, and the diameter of the cavity defined by the side walls 922, 915 is between 12 mm and 26 mm. In such embodiment the cavity may support a pressure standing wave frequency in a gas of between 15 kHz and 35 kHz. More preferably, the heights of the cavities at the centres of the end walls 920, 913 is between 100 μm and 500 μm, the heights of the cavities at the side walls 922, 915 is between 1 mm and 2 mm, and the diameters of the cavities defined by the side walls 922, 915 is between 16 mm and 24 mm. In such embodiment the cavity may support a pressure standing wave frequency in air of around 21 kHz.

The pump 970 of FIG. 9A provides a direct pneumatic interconnect in the form of aperture 9130 in the combined actuator and isolator 977 which allows fluid to flow from the upper cavity 923 to the lower cavity 916.

The position of the aperture 9130 in the combined actuator and isolator 977 is between the centre of the combined actuator and isolator 977 and the side walls 915, 922. In a preferred embodiment the aperture 9130 is located at a radial distance (r) from the centre of the combined actuator and isolator 977, where (r) is between approximately 0.43a and 0.83a, and more preferably close to 0.63a, i.e., close to the nodal points of the pressure oscillations as shown in FIG. 1C.

In operation the pump draws air through the filter membrane 978, through the lower valve 974b, through the aperture 9130 in the combined actuator and isolator 977, through the upper valve 974a and out of the pump outlet 980. This provides an acoustic resonance pump with the two cavities 916 and 923 in series.

Figure 9B:
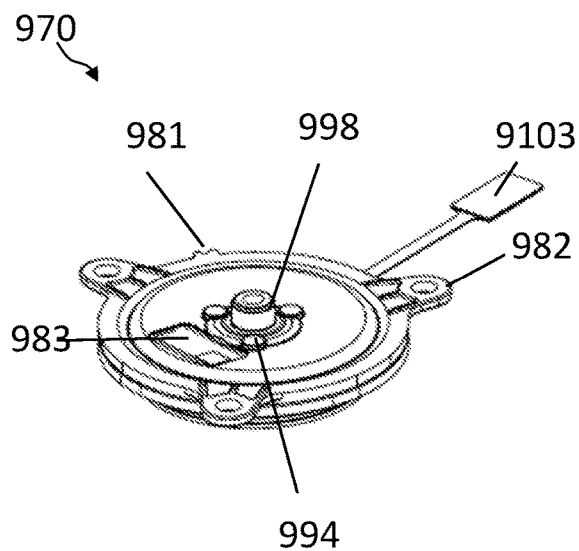
FIGS. 9B and 9C show isometric views of the pump shown in FIG. 9A.
Figure 9C:
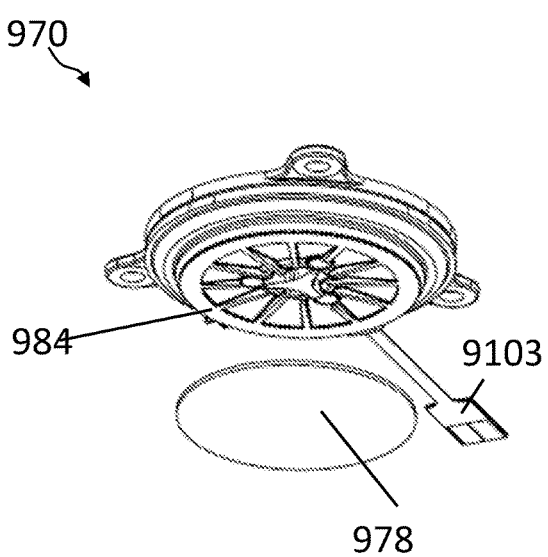
Figure 9D:
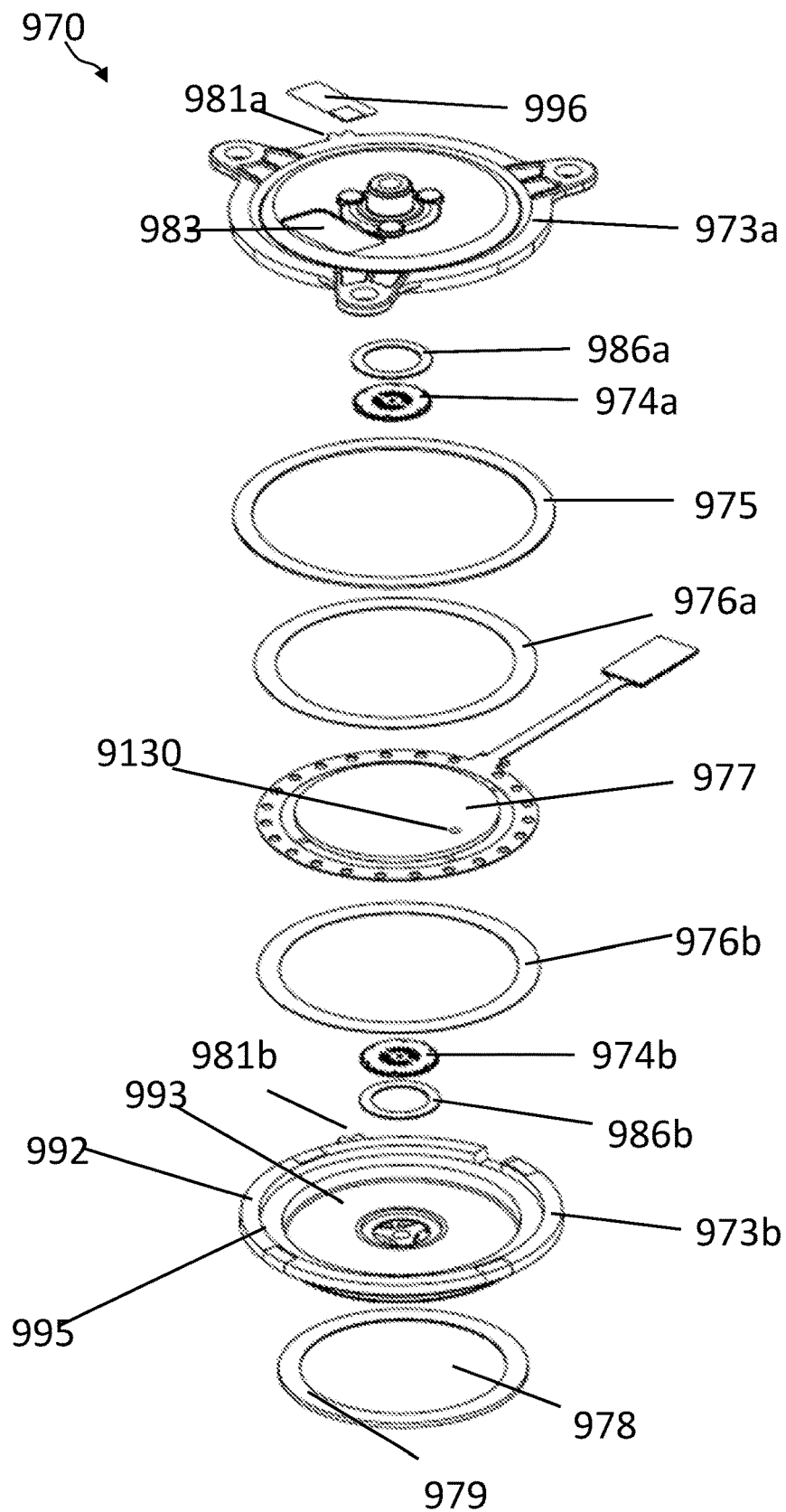
FIG. 9D shows an exploded view of the pump shown in FIG. 9A.

FIG. 9D shows an exploded view of the pump 970 described in FIG. 9A, and along with FIGS. 9B and 9C shows details of the individual components.

The upper pump body 973a and lower pump body 973b combine to form the main body of the Pump 970. The pump bodies 973a and 973b may be formed from plastic, metal, semiconductor, ceramic or any other material or composite material and may be formed by machining, injection molding, stamping or another process. In one preferred embodiment, the pump bodies 973a, 973b are formed from injection moulded, glass-filled plastic.

The upper pump body 973a and lower Pump body 973b may provide features aiding automated pump assembly, for example alignment feature 981a on the upper pump body 973a and alignment feature 981b on the lower pump body 973b. During assembly these features provide mechanical keying to ensure the rotational alignment of the pump bodies 973a, 973b. A second example is chamfered surfaces 995 on the mating surfaces of the pump bodies 973a, 973b. The upper pump body 973a and lower Pump body 973b may provide features aiding integration and identification of the pump. These may include a recess 983 for locating and recessing an identification label 996, pump mounting features 982, and a shaped spigot 998 at the pump outlet for connection of the pump to the pneumatic circuit.

The upper pump body 973a and lower pump body 973b may provide features aiding injection moulding. These may include multiple injection gates 994 placed close to the centre of the bodies 973a, 973b to aid the flow of material during moulding. The injection gates 994 may be designed to be sub-flush to the surface of the pump bodies 973a, 973b to prevent gating defects leading to increased pump thickness.

The surfaces of the pump bodies 973a and 973b may be rough-textured 992 in selective regions where any of the adhesive beads 972a,972b, 975, 986a, 986b, 976 bond to the pump bodies 973a, 973b to improve adhesion, or in other regions for visual contrast, grip, adhesion or another purpose.

The surfaces of the pump bodies 973a and 973b may be smooth-textured 993 in selective regions to provide good sealing to external connections and o-rings (on the outlet spigot 998 for example), to reduce viscous drag in regions of high air flow, such as within the pumping cavity, or to provide good adhesion for pressure sensitive adhesives (on the label recess 983 for example), or for another purpose.

The combined actuator and isolator 977 is described further with regards to FIGS. 5, 6 and 7. In a preferred embodiment the combined actuator and isolator 977 may be formed from: a piezoelectric disc 42 formed form lead zirconate titanate; an end plate 41 formed from a metal such as aluminium, steel, titanium, or nickel, or alloys such as nickel-iron or molybdenum-copper; a flexible circuit 43 formed from polyimide base material 106 and covering layers 108a, 108b, and conductors 107a, 107b formed from a metal such as copper, beryllium-copper, copper-nickel, or Inconel. In this preferred embodiment it is desirable that the metal end plate 41 has a similar coefficient of thermal expansion to the piezoelectric disc 42, and that the metal conductors 107a, 107b in the flexible circuit 43 are formed from a metal capable of undergoing a high number of mechanical cycles without failure. The piezoelectric disc 42, the flexible circuit 43 and the end plate 41 may be joined by any suitable method including without limitation gluing. In a preferred embodiment, the piezoelectric disc 42, the flexible circuit 43 and the end plate 41 are joined using a thermal cured epoxy with a high glass transition temperature.

The valves 974a and 974b may be any high frequency valve of suitable response time and open flow restriction. In a preferred embodiment the valves 974a and 974b are made of a laminate construction of metal and plastic layers as disclosed herein, and in Patent Applications WO2010/139917, PCT/GB2019/053458 and PCT/GB2019/053459.

The filter 978 prevents particles entering the pump via the pump inlet, which may potentially cause damage to the valves 974a, 974b. The filter 978 may be a sheet filter, depth filter, active filter or any other sort of filter. The filter 978 may be made from plastic, metal, semiconductor or any other material. In one preferred embodiment the filter 978 is formed from an PTFE membrane supported on a polyester or polypropylene non-woven supporting layer. In another preferred embodiment the filter 978 is formed from an acrylic copolymer matrix formed around a nylon non-woven supporting layer. In both of these preferred embodiments that filter 978 has a thickness of less than 1.0 mm and an effective pore size of less than 10 um.

Referring to FIG. 9C, the components of the pump 970 may be joined and pneumatically sealed by a number of adhesive beads: the pump adhesive bead 975 which joins and pneumatically seals the pump bodies 973a, 973b; the flexible circuit adhesive bead 976 which joins and pneumatically seals the combined actuator and isolator 977 to the pump bodies 973a, 973b; the valve adhesive beads 986a and 986b which join and pneumatically seal the valves 974a, 974b to the pump bodies 973a, 973b; the filter adhesive bead 979 which joins and pneumatically seals the filter 978 to the lower pump body 973b. The adhesive beads may be formed of the same or different materials from one another. The adhesive beads may be formed from adhesive with properties specifically selected to be hard, soft, brittle, or compliant. In a preferred embodiment the adhesive beads may be formed by a UV curing adhesive. The filter adhesive bead 979 may comprise multiple, discrete beads across the filter 978 providing multiple bonding locations and therefore good support of the filter 978. Preferably the filter adhesive bead 979 comprises a ring-shaped bead applied at the edge of the filter 978 and a discrete bead applied close to the centre.

The function of any of the adhesive beads may be replaced by one or a combination of alternative methods of joining and or sealing. Joining methods may include pressure sensitive adhesive, interference fits, mechanical fixtures such as clips, screws, and clamps, laser welding, electrical welding, solvent welding, diffusion bonding, or any other method. Sealing methods may include pressure sensitive adhesive, gaskets, o-rings, sealing grease, interference fits, or any other method.

It will be recognised that the thicknesses 990 of the pump embodiment 970 shown in FIG. 9A can be smaller than the thicknesses 490 of the pump embodiment 470 shown in FIG. 4A as a result of the direct pneumatic interconnect. This provides an advantage to end-product designers, particularly of portable or wearable products where light weight and small size are important.

FIG. 10 illustrates several methods of forming the aperture 130 through the actuator region 104 of the combined actuator and isolator 77, highlighting several manufacturing challenges. During operation, the piezoelectric disc 42 expands and contracts radially, causing the actuator region 104 to bend by reaction of the piezoelectric disc 42 against the end plate 41 via the adhesive bonds and flexible circuit 43. The actuator must withstand the resulting stresses for a very high number of cycles ($1 \times 10^{11}$ or more) in order to meet typical product requirements. Any defects introduced into the actuator structure via the aperture forming process may lead to cracking of the ceramic or delamination of the actuator components during use, leading to failure of the pump.

FIG. 10A shows a hole 135a formed by drilling through an assembled actuator region 104. This is the simplest approach, as no additional complexity is introduced into the assembly of the piezoelectric disc 42, flexible circuit 43 and end plate 41. In this example "drilling" includes any process used to remove material in selective areas including but not limited to mechanical abrasion or cutting, laser ablation or drilling, water-jet drilling, and etching. Unfortunately, the use of any such drilling process tends to lead to the formation of defects 140 at the interfaces between the piezoelectric disc 42, flexible circuit 43, and end plate 41, or defects 141 within one of the components 41, 42, 43. Defects 141 within the piezoelectric disc 42 are particularly problematic, as they may cause the piezoelectric disc 42 to fail by cracking. The hole 135a must be large enough to allow air to flow through the pump without substantial resistance, but small enough to avoid disruption to the pressure oscillations in the pump cavities. In a preferred embodiment the hole 135*a* is between 0.3 mm and 2 mm in diameter. There may be one or more holes formed in the actuator region 104.

FIG. 10B shows an alternative example where a larger hole 133 is pre-formed in the piezoelectric disc 42 by cutting or punching, for example when the ceramic is in the so-called "green state" prior to firing. Following assembly of the actuator a smaller hole 135*b* is drilled through the flexible circuit 43 and the end plate 41 using the hole 133 as a guide. This construction has a number of advantages. Firstly, when the piezoelectric disc 42 is assembled with the flexible circuit 43 and end plate 41, an adhesive fillet 143 is formed naturally between the piezoelectric disc 42 and the flexible circuit 43, preventing defects forming at the boundary between the piezoelectric disc 42 and the flexible circuit 43 and avoiding stress concentrations. Secondly, no defects are introduced into the ceramic structure. Another advantage of this approach is that no alignment of the components is necessary during assembly, facilitating manufacture. Some defects 140 may still remain, however as these are not in highly-stressed regions they may not contribute to actuator failure. The holes 133 and 135*b* must be large enough to allow air to flow through the pump without substantial resistance, but small enough to avoid disruption to the pressure oscillations in the pump cavities. In a preferred embodiment the smaller hole 135*b* is between 0.3 mm and 2 mm in diameter and the larger hole 133 is between 1 mm and 3 mm in diameter. There may be one or more holes formed in the actuator region 104. The edges of the holes may be smoothed or chamfered to aid air flow in these regions.

FIG. 10C shows an example where a preformed hole 133 in the piezoelectric disc 42 and a preformed hole 134 in the flexible circuit 43 are aligned during assembly, and a hole 135*c* is drilled through the end plate 41 by conventional means using the holes 133 and 134 as a guide following assembly. Alternatively, all three holes may be formed prior to assembly. This design provides adhesive fillets 143 at the interfaces between the piezoelectric disc 42 and flexible circuit 43, and the flexible circuit 43 and end plate 41. A disadvantage of this design is the requirement to align the two holes 133 and 134. The holes 133, 134, and 135*c* must be large enough to allow air to flow through the pump without substantial resistance, but small enough to avoid disruption to the pressure oscillations in the pump cavities. In a preferred embodiment the hole 135*c* is between 0.3 mm and 2 mm in diameter and the holes 134 and 133 are between 1 mm and 3 mm in diameter. There may be one or more holes formed in the actuator region 104.

The design shown in FIG. 10C may also be changed so that the hole in the piezoelectric disc 42 is smallest, and the hole in the end plate 41 is largest, with all three holes formed prior to assembly.

One challenge of mechanically aligning the structure shown in FIG. 10C is that the holes are of different sizes in each of the components 41, 42, 43. If instead the holes can be made to be approximately the same size, mechanical alignment can be more readily achieved, for example by placing an alignment pin through the holes. However, in use it is likely that such an alignment pin will become stuck to the adhesive and the adhesive fillets 143 may be disrupted.

FIG. 10D shows an embodiment which overcomes this challenge. The flexible circuit 43 described in FIG. 6B consists of three layers; upper flexible circuit conductor 107*a*, flexible circuit substrate 106 and lower flexible circuit conductor 107*b*. In the embodiment illustrated in FIG. 10D, the diameter of the pre-formed hole 134 formed in the flexible circuit substrate layer 106 is similar in size to the pre-formed hole 133 in the piezoelectric disc 42 and the pre-formed hole 138 in the end plate 41, but smaller than the preformed holes in the upper flexible circuit conductor 107*a* and lower flexible circuit conductor 107*b*. This structure gives rise to a recess 136 within which the adhesive fillet 143 may form, preventing the adhesive contacting any alignment pin used to align the components 41, 42, 43. The hole 133 must be large enough to allow air to flow through the pump without substantial resistance, but small enough to avoid disruption to the pressure oscillations in the pump cavities. In a preferred embodiment the hole 133 is between 0.3 and 2 mm in diameter. There may be one or more holes formed in the actuator region 104.

As discussed with regards to FIG. 1A, it is undesirable to place unvalved apertures in a cavity at positions away from the node 57 of the pressure standing wave as this will result in loss of energy from the pressure standing wave and a reduction in pump performance. However in practice, placing a hole through the isolator region 102 of a combined actuator and isolator 77 may be easier and more cost-effective than placing a hole through the actuator region 104, while also avoiding the robustness challenges described above with reference to FIG. 10.

Figure 11B:
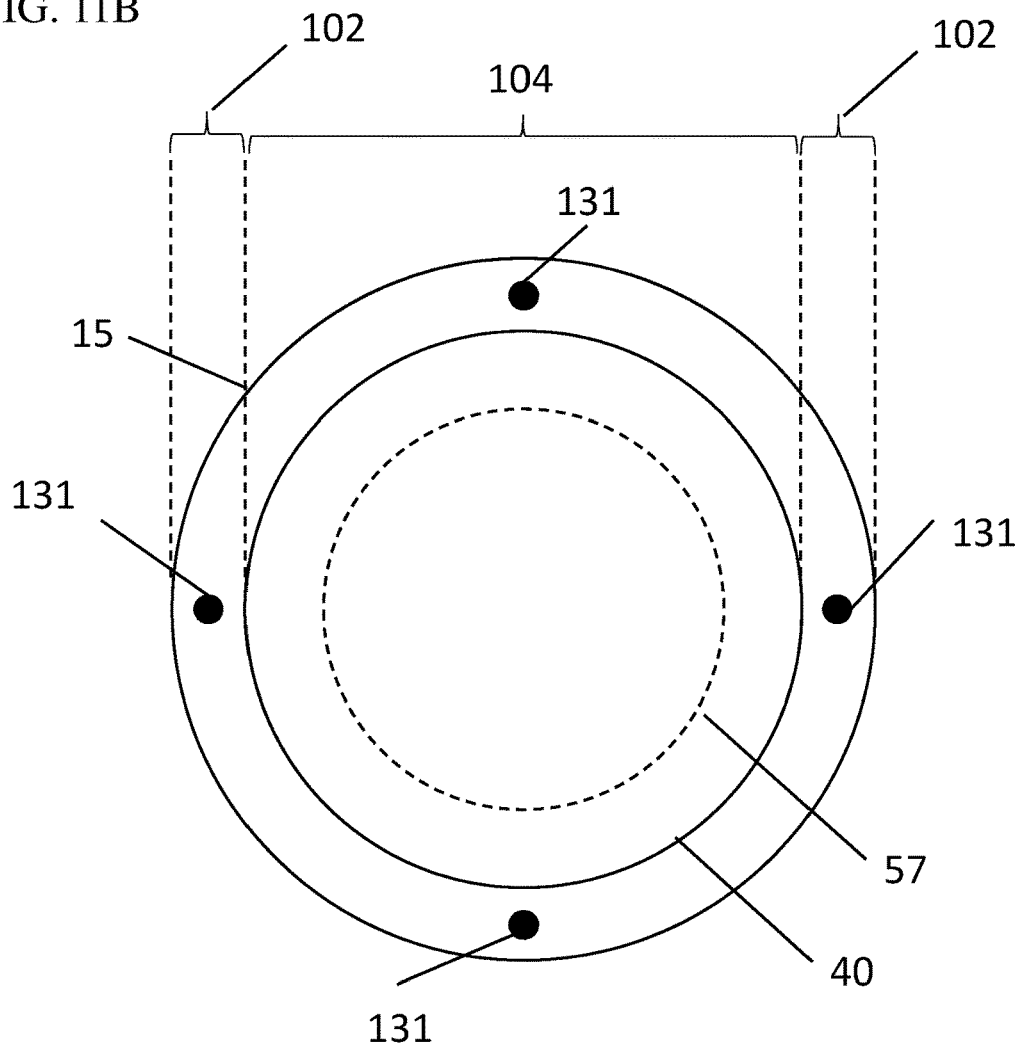
FIG. 11B shows a schematic for a combined actuator and isolator which includes a pneumatic interconnect of the isolator located away from a pressure oscillation node, according to the invention.

FIG. 11B shows holes 131 provided in the isolator region 102 of a combined actuator and isolator 77. These holes 131 are located between the outer edge of the actuator 40 and the wall of the cavity 15. As holes 131 are located away from the position of the node 57 of the cavity pressure standing wave, they should be expected to have a detrimental effect on pump performance.

FIG. 11A shows experimental results of the relative pneumatic performance (as measured by either pressure, flow or a combination of these two parameters generated by the pump in operation) of an acoustic resonance pump in which the number of holes 131 provided in the isolator region 102 is increased. The relative performance may be a measure of pneumatic pressure or flow rate or a combination of the generated by the pump. The horizontal axis indicates the fraction of the end wall of the cavity which is open between the two cavities. These results demonstrate that it is possible to maintain high pump performance using non-nodal holes 131 in the isolator region 102 so long as the open area of such holes remains small. Having a total combined open area of non-nodal holes 131 below 10% of the end wall area enables better than 50% of the ideally available performance to be achieved. Reducing this to below 5% enables better than 70% of the ideally available performance to be achieved, whilst reducing this further to providing a total combined open area below 1% of the end wall area enables better than 95% of the ideal pneumatic performance to be achieved.

The holes 131 in the isolator region 102 may be circular, oblong, elliptical, rounded oblong, or any other shape. The holes 131 may be made by any process including mechanical or laser machining, stamping, etching, water-jet drilling, or any other process. The holes 131 may be any size and distributed around the isolator an any pattern. In a preferred embodiment the total combined open area of all holes 131 will be less than 10% of the area of the end wall, more preferably less than 5% and even more preferably less than 1%. In another preferred embodiment there will be one hole 131 which is between 0.3 and 2 mm in diameter. In another preferred embodiment there will be four holes 131, each between 75 µm and 1 mm in diameter. In this embodiment the holes 131 will be evenly distributed around isolator region 102 to reduce disruption to the pressure oscillations in the pump cavities.

Such a design may provide benefits in cost, manufacturability and robustness over a direct pneumatic connection via a hole 130 in the actuator region 104. However the isolator region 102 undergoes high-frequency stresses in operation, and holes 131 can become a source of weakness and/or stress concentration in the isolator, leading to cracking or failure of the isolator region 102. FIG. 12 shows two methods of reinforcing holes 131 in the isolator region 102 to prevent failure.

Figure 12A:
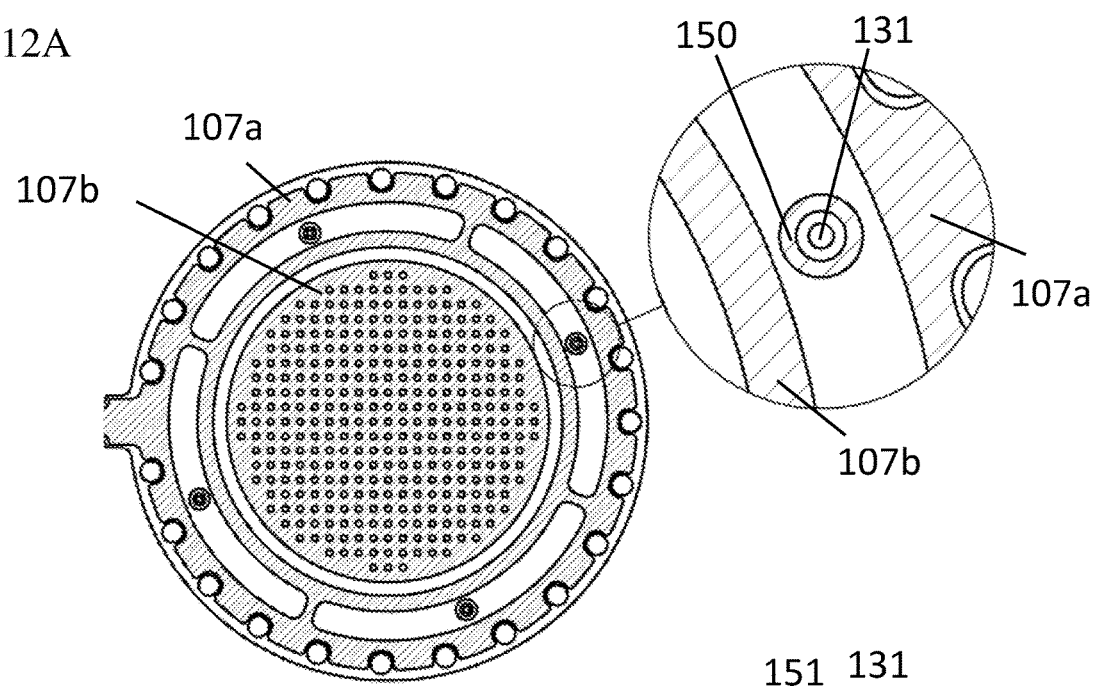
FIG. 12 shows two examples of flexible circuit designs which provide robust pneumatic interconnects located away from pressure oscillation nodes.
Figure 12B:
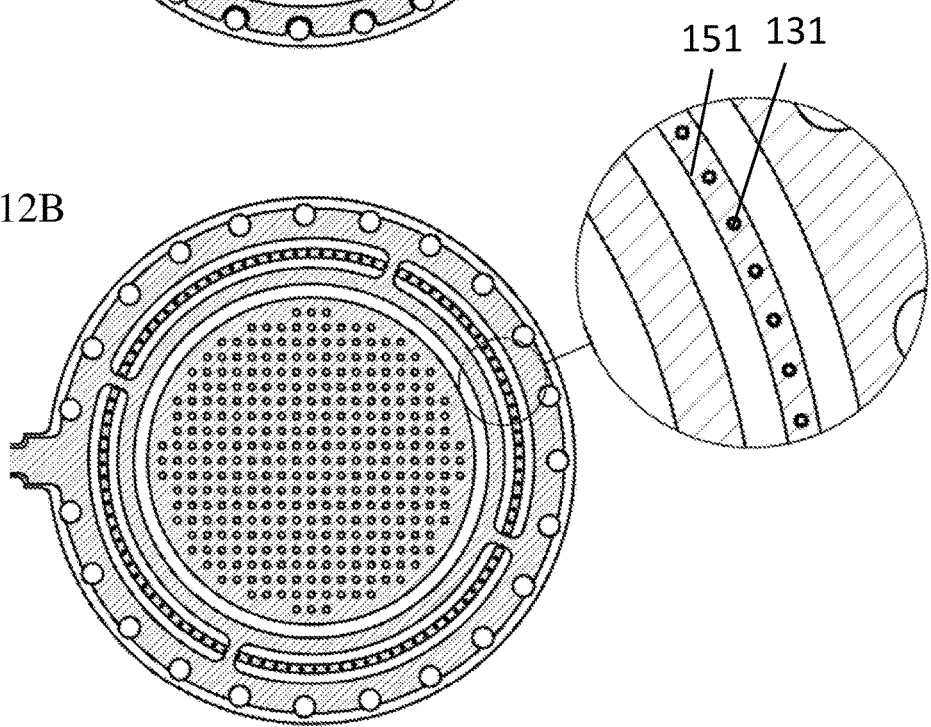
Figure 12C:
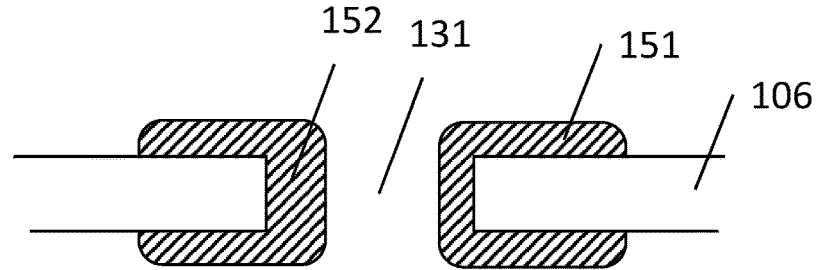

FIG. 12A shows a flexible circuit in which holes 131 are provided in the isolator region 102 through the flexible circuit substrate 106. These holes are surrounded by an annular reinforced region 150. The reinforced region 150 is shown as an annulus, but may be any shape or size and may not fully enclose the hole. FIG. 12B shows a second embodiment in which a continuous ring of reinforcing material 151 runs around the circumference of the isolator region 102 and is perforated by holes.

In either embodiment reinforcing regions 150, 151 may be formed as part of the flexible circuit manufacturing process (for example by extension of the flexible circuit conductors 107*a*, 107*b* or extension of the flexible circuit capping layer 108*a*, 108*b* or otherwise). Alternatively, they may be added via a secondary process such as printing, coating or any other process, or any combination of these options. These regions of reinforced material acts as a barrier preventing crack initiation and or propagation which may initiate at the edge of holes 131. The holes 131 may be formed by mechanical or laser machining, stamping, etching water jet drilling, or any other process. In a preferred embodiment illustrated in FIG. 12C, the holes and reinforced regions are formed as 'vies' as part of standard flexible circuit manufacture to provide a hole 131 which encapsulated by the conductor 152.

In a preferred embodiment the total combined open area of all holes 131 will be less than 1% of the area of the end wall, the flexible circuit substrate 106 is between 5 μm and 200 μm in thickness, flexible circuit conductors 107*a*, 107*b* are between 5 μm and 200 μm in thickness, and via conductor 152 is between 1 μm and 100 μm in thickness.

In another preferred embodiment there is one hole 131 which is between 0.3 and 2 mm in diameter, the flexible circuit substrate 106 is between 5 μm and 100 μm in thickness, flexible circuit conductors 107*a*, 107*b* are between 5 μm and 50 μm in thickness, and via conductor 152 is between 1 μm and 50 μm in thickness.

In another preferred embodiment there are four holes 131, each between 75 μm and 500 μm in diameter, the flexible circuit substrate 106 is between 5 μm and 100 μm in thickness, flexible circuit conductors 107*a*, 107*b* which are between 5 μm and 50 μm in thickness, and via conductor 152 is between 1 μm and 50 μm in thickness.

In another preferred embodiment there are 100 holes 131, each between 15 μm and 100 μm in diameter, the flexible circuit substrate 106 is between 5 μm and 100 μm in thickness, flexible circuit conductors 107*a*, 107*b* are between 5 μm and 50 μm in thickness, and via conductor 152 is between 1 μm and 50 μm in thickness.

With reference to FIG. 8C, one further embodiment of a direct pneumatic interconnect is now described which links upper cavity 23' and lower cavity 16' by means of an air path 129 at radius greater than that of the side walls 15, 22. In a preferred embodiment the air path 129 is provided by a set of radial grooves in the clamping surface of the pump bodies 73*a* and 73*b*, and an axial channel beyond the diameter of the isolator 30, or through the clamped section of the isolator. To reduce disruption to the pressure oscillations in the pump cavities, the aperture defined where the air path 129 intersects the cavities 16' and 23' should be less than 10% of the area of the end wall, more preferably less than 5% of the area of the end wall, even more preferably less than 1% of the area of the end wall.

It will be understood that the invention has been described in relation to its preferred embodiments and may be modified in many different ways without departing from the scope of the invention as defined by the accompanying claims.

The invention claimed is:

1. A method of making an actuator for a resonant acoustic pump, the method comprising:
    forming a through-hole in a ceramic material of a piezoelectric layer of the actuator, prior to assembly of the piezoelectric layer with other layers of the actuator;
    forming a through-hole in a flexible circuit layer of the actuator;
    forming a through-hole in an end plate layer of the actuator; and
    disposing each of the piezoelectric layer and the end plate layer on a respective one of opposite sides of the flexible circuit layer, so that the through-hole in the ceramic material of the piezoelectric layer, the through-hole in the flexible circuit layer and the through-hole in the end plate layer align to provide a passageway for a fluid to pass through the actuator.

2. The method according to claim 1, further comprising:
    forming the through-hole in the ceramic material of the piezoelectric layer of the actuator prior to firing the ceramic material; and
    disposing the fired piezoelectric layer on the respective one of the opposite sides of the flexible circuit layer.

3. The method according to claim 1, further comprising forming the through-hole in the flexible circuit layer after disposing the piezoelectric layer on the flexible circuit layer.

4. The method according to claim 1, further comprising forming the through-hole in the end plate layer after disposing the end plate layer on the flexible circuit layer.

5. The method according to claim 1, further comprising forming the through-hole in the flexible circuit layer before disposing the piezoelectric layer on the flexible circuit layer.

6. The method according to claim 1, further comprising forming the through-hole in the end plate layer before disposing the end plate layer on the flexible circuit layer.

7. The method according to claim 1, wherein forming the through-hole comprises removing material from the respective layer.

8. The method according to claim 1, further comprising forming each of the through-hole in the ceramic material, the through-hole in the flexible circuit layer and the through-hole in the end plate layer to extend through the respective layer substantially perpendicularly to a plane of the respective layer, such that the passageway extends substantially perpendicularly to a plane of the actuator when the piezoelectric layer and the end plate layer are disposed on the opposite sides of the flexible circuit layer.

9. The method according to claim 1, further comprising:
    forming the through-hole of the piezoelectric layer to have a first width;
    forming the through-hole of the flexible circuit layer to have a second width that is smaller than the first width; and
    disposing the piezoelectric layer on the flexible circuit layer using an adhesive layer therebetween, so as to provide an adhesive fillet at an interface between the through-hole of the piezoelectric layer and the flexible circuit layer.

10. The method according to claim 9, wherein:
the first width is between 1 mm and 3 mm; and
the second width is between 0.3 mm and 2 mm.

11. The method according to claim 9, further comprising:
forming the through-hole of the end plate layer to have a third width that is smaller than the second width; and
disposing the end plate layer on the flexible circuit layer using an adhesive layer therebetween, so as to provide an adhesive fillet at an interface between the through-hole of the flexible circuit layer and the end plate layer.

12. The method according to claim 11, wherein the third width is between 0.3 mm and 2 mm.

13. The method according to claim 1, wherein the flexible circuit layer comprises a substrate sub-layer located between first and second conductor sub-layers, the method further comprising:
forming the through-hole of the piezoelectric layer to have a first width;
forming the through-hole of the end plate layer to have a second width that is substantially the same as the first width;
forming the through-hole of the flexible circuit layer such as to have:
a third width through the substrate sub-layer that is substantially the same as the first width; and
a fourth width through at least one of the first and second conductor sub-layers that is greater than the first width; and
disposing each of the piezoelectric layer and the end plate layer on a respective one of the first and second conductor sub-layers using an adhesive layer therebetween, so as to provide an adhesive fillet in a recess formed at the fourth width between at least one of the piezoelectric layer and the end plate layer, and the substrate sub-layer.

14. The method according to claim 13, wherein the first width is between 0.3 mm and 2 mm.

15. The method according to claim 1, further comprising forming a plurality of through-holes in each of the piezoelectric layer, the flexible circuit layer, and the end plate layer, thereby to provide a plurality of passageways for the fluid to pass through the actuator.

16. An actuator for a resonant acoustic pump, made according to the method of claim 1.

17. A resonant acoustic pump comprising an actuator made according to the method of claim 1, wherein the passageway is located at a radial distance of about 0.63 (r)+/−0.2(r) from a centre of the actuator where r is the radius of a cavity in the resonant acoustic pump.

* * * * *